United States Patent
Kawahara et al.

(10) Patent No.: US 8,133,321 B2
(45) Date of Patent: Mar. 13, 2012

(54) PROCESS FOR PRODUCING SILICON CARBIDE SINGLE CRYSTAL

(75) Inventors: Takamitsu Kawahara, Kawasaki (JP); Kuniaki Yagi, Ome (JP); Naoki Hatta, Zama (JP); Hiroyuki Nagasawa, Inagi (JP)

(73) Assignee: Hoya Corporation, Tokyo (JP)

( * ) Notice: Subject to any disclaimer, the term of this patent is extended or adjusted under 35 U.S.C. 154(b) by 1140 days.

(21) Appl. No.: 11/886,065

(22) PCT Filed: May 23, 2006

(86) PCT No.: PCT/JP2006/310225
§ 371 (c)(1),
(2), (4) Date: Oct. 2, 2007

(87) PCT Pub. No.: WO2006/132082
PCT Pub. Date: Dec. 14, 2006

(65) Prior Publication Data
US 2008/0289570 A1    Nov. 27, 2008

(30) Foreign Application Priority Data
Jun. 7, 2005  (JP) ................ 2005-167326

(51) Int. Cl.
*C30B 25/18* (2006.01)
(52) U.S. Cl. ............ 117/97; 117/84; 117/90; 117/94; 117/95; 117/106; 438/689
(58) Field of Classification Search ............ 117/84, 117/90, 94–95, 97, 106, 951; 438/689
See application file for complete search history.

(56) References Cited

U.S. PATENT DOCUMENTS

| | | | |
|---|---|---|---|
| 6,335,546 B1 * | 1/2002 | Tsuda et al. | 257/94 |
| 6,416,578 B1 * | 7/2002 | Nakano et al. | 117/94 |
| 6,475,456 B2 * | 11/2002 | Nakano et al. | 423/328.2 |
| 6,736,894 B2 * | 5/2004 | Kawahara et al. | 117/2 |
| 7,101,774 B2 * | 9/2006 | Nagasawa et al. | 438/478 |
| 2002/0035960 A1 | 3/2002 | Nakano et al. | |
| 2002/0124793 A1 | 9/2002 | Nakano et al. | |
| 2003/0045102 A1 * | 3/2003 | Nagasawa et al. | 438/689 |
| 2003/0047129 A1 * | 3/2003 | Kawahara et al. | 117/2 |

FOREIGN PATENT DOCUMENTS

| | | |
|---|---|---|
| JP | A 2000-178740 | 6/2000 |
| JP | A 2002-201098 | 7/2002 |
| JP | A 2003-068655 | 3/2003 |

OTHER PUBLICATIONS

K. Shibahara et al., "Antiphase-Domain- Free Growth of Cubic SiC on Si(100)", Appl. Phys. Lett., vol. 50, No. 26 Jun. 1987, pp. 1888-1890.

\* cited by examiner

Primary Examiner — Robert M Kunemund
Assistant Examiner — Kenneth A Bratland, Jr.
(74) Attorney, Agent, or Firm — Oliff & Berridge, PLC

(57) ABSTRACT

A process for producing a silicon carbide single crystal in which a silicon carbide single crystal layer is homo-epitaxially or hetero-epitaxially grown on a surface of a single crystal substrate, wherein a plurality of substantially parallel undulation ridges that extend in a first direction on the single crystal substrate surface is formed on said single crystal substrate surface; each of the undulation ridges on said single crystal substrate surface has a height that undulates as each of the undulation ridges extends in the first direction; and the undulation ridges are disposed so that planar defects composed of anti-phase boundaries and/or twin bands that propagate together with the epitaxial growth of the silicon carbide single crystal merge with each other.

16 Claims, 19 Drawing Sheets

PROCESS FOR PRODUCING SILICON CARBIDE SINGLE CRYSTAL

TECHNICAL FIELD

The present invention relates to a process for producing a silicon carbide single crystal that makes it possible to produce a silicon carbide single crystal having a low defect density or lower lattice distortion and having a potential application as semiconductor devices or other electronic material.

BACKGROUND ART

Bulk growth by sublimation and thin film formation by epitaxial growth on a substrate have conventionally been known as growth methods for a silicon carbide single crystal. In the case of bulk growth by sublimation, a hexagonal (6H, 4H, and the like) silicon carbide single crystal, which is a higher temperature polytype, can be grown, and a single crystal substrate composed of silicon carbide as such can be fabricated. However, a considerable number of defects (micropipes in particular) is introduced into the crystal, and complications have arisen in regard to expanding the substrate surface area.

In contrast, the doping of impurities can be more easily controlled, the wafer diameter can be expanded, and micropipes that are problematic in sublimation can be reduced when epitaxial growth on a single crystal substrate has been used. However, there is a problem with epitaxial growth in that the density of planar defects due to differences in the lattice constant between the substrate and the silicon carbide is often increased. Silicon in particular, which is commonly used as the substrate for epitaxial growth, has a large lattice mismatch with silicon carbide. Therefore, the occurrence of anti-phase boundaries (APB) and twins in the silicon carbide single crystal growth layer is enhanced. These phenomena induce a leakage-current when semiconductor devices are fabricated, and degrade the performances of semiconductor devices composed of silicon carbide.

A method for growing a silicon carbide single crystal on a (001) face of silicon single crystal substrate whose normal axis is slightly inclined from the <001> directions toward <110> directions (to which an off-angle has been introduced) has been proposed by K. Shibahara, et al. (Non-patent Document 1) as a method of effectively reducing anti-phase boundaries.

FIG. 5 shows a schematic example of a substrate 50 to which an off-angle has been introduced (hereinafter referred to as "off-substrate"). In FIG. 5, reference numeral 50 is an off-substrate, and 51 is a step (height difference) with an atomic level height. Also in FIG. 5, the surface of the paper corresponds to the (−110) plane, and the steps 51 with an atomic level height are oriented orthogonally to the surface of the paper, i.e., the [110] direction. The steps with an atomic level height are introduced in an equidistant manner in a single direction by giving the substrate a slight incline. Therefore, epitaxial growth is carried out in a step-flow mode in the vapor growth method, which is effective in reducing the propagation of planar defects toward the introduced step edges (the direction crosswise to the steps). For this reason, the anti-phase domain preferably expands in the direction parallel to the introduced steps rather than its orthogonal direction with an increase in film thickness. Therefore, the anti-phase boundaries can be effectively reduced.

However, methods that use this off-substrate have had the following problems. FIG. 6 schematically shows the presence of anti-phase boundaries for the case in which a silicon carbide single crystal layer is formed to a fixed thickness on an off-substrate composed of a silicon single crystal. The crystal orientation in FIG. 6 is the same as that in FIG. 5. In FIG. 6, reference numeral 61 is a silicon carbide film, 62 and 63 are anti-phase boundaries, 64 is an anti-phase boundary junction, θ is the off-angle from [001] axis, and φ is the interior-angle (54.7°) between Si(001) and the anti-phase boundary.

The anti-phase boundaries 63 generated on the terraces (flat portions) of the surface of the silicon substrate annihilate at the anti-phase boundaries junction 64, but the anti-phase boundary 62 generated on a mono atomic height step of the silicon substrate does not have a junction counterpart and is therefore not eliminated, as shown in FIG. 6. In other words, methods in which an off-substrate is used have problems in that the step density of the boundary between the silicon carbide and the silicon substrate is increased, anti-phase boundaries and twin bands are, generated inevitably, and the anti-phase boundaries are not completely eliminated.

In view of the above, the present applicant has proposed (see Patent Documents 1 and 2), as a method of reducing the twin bands or the anti-phase boundaries (hereinafter generically referred to as "planar defects") within such a silicon carbide single crystal, a technique for reducing planar defects that propagate within the silicon carbide single crystal layer by epitaxially growing a silicon carbide single crystal layer on a substrate provided with undulations whose ridges are aligned in a specific direction on the surface of the silicon substrate.

Specifically, the microscopic view of the surface of undulations fabricated on a silicon single crystal substrate is one in which slopes face each other, as shown in FIG. 5. When a silicon carbide single crystal layer is deposited on the substrate, the anti-phase boundaries, which are generated at the edge of the mono atomic height steps of the surface of the silicon carbide single crystal substrate formed on the mutually facing off-slopes, are propagated so as to face each other with increasing thickness, and these finally merge and annihilate.

[Non Patent Document 1]
Applied Physics Letters, v(50), 1987, p. 1888
[Patent Document 1]
JP-A 2000-178740
[Patent Document 2]
JP-A 2003-68655

DISCLOSURE OF THE INVENTION

Prior-Art Problems

According to the understanding of the present inventors, the density of anti-phase boundaries in a silicon carbide single crystal layer decreases as the thickness of the silicon carbide single crystal layer increases when a silicon carbide single crystal layer is formed using this method, but the anti-phase domains are not perfectly annihilated. FIG. 7 schematically shows the presence of anti-phase domains on the surface of a silicon carbide single crystal on which a silicon single crystal substrate on which undulations have been formed has been deposited. In FIG. 7, reference numeral 71 is an anti-phase boundary, 72 and 73 are deposited silicon carbide single crystal domains, and the stacking-order of the silicon and carbon in the two domains is reversed. Also, in FIG. 7, the undulation ridges are aligned in the [−110] direction, and the surface of the paper corresponds to the (110) plane.

In view of the silicon carbide single crystal layer formed in the manner schematically shown in FIG. 7, the anti-phase domains are mostly annihilated at the junction according to the cancellation mechanism described above in the direction (the [110] direction) orthogonal to the undulation ridges, but the anti-phase domains in the direction parallel to the undulation ridges (the [−110] direction) still remain. This mechanism is described in detail below.

FIG. 8 is a schematic diagram showing a silicon single crystal substrate on which undulations have been fabricated. In FIG. 8, reference numeral 81 is a silicon single crystal substrate, and 82 is an area of a portion of the slope of the undulations. The direction of undulation ridges is aligned in [1-10] direction. The period of the undulation ridges may be adjusted to about 0.01 µm to 1 mm, and a range of 0.1 µm to 10 µm is particularly advantageous. The peak-valley height of the undulations may be suitably set to about 1 nm to 50 µm, and a range of 10 to 100 nm is particularly advantageous. Also, the slope angle of the undulations may be 0.1° to 54.7°, i.e., less than the angle formed by the (001) plane and the (111) plane in a cubic system, and a range of 1° to 6° is particularly advantageous.

FIG. 9 schematically shows the process by which a silicon carbide film is grown by way of a step-flow mode, and corresponds to a diagram in which the area 82 of the portion of the slope of the undulations shown in FIG. 8 has been enlarged. In FIG. 9, reference numeral 91 is a mono atomic height step, 92 is a terrace of the surface of a silicon single crystal, 93 is the edge of a step, and 94 is silicon carbide.

Even if the mono atomic height step 91 and the terrace 92 are ideally and continuously formed on the surface of a silicon single crystal substrate 81 in a perfect manner, if a silicon carbide film is furthermore ideally and continuously formed on the surface of a silicon single crystal substrate 81, and if a silicon carbide film is ideally and perfectly grown in a step flow mode, the stacking order of the silicon carbide film that is grown on the terrace portion is the same and is, looking at a single terrace, in phase in the direction in which the undulations extend. In such a case, anti-phase boundaries in the silicon carbide film are boundaries that are generated at the edge 93 of a step, and these are propagated along the (−1-11) plane with an increase in the thickness of the silicon carbide film.

On the other hand, the same situation applies to other opposing incline planes of the undulations not shown in FIG. 9, and in this case, the anti-phase boundaries propagate along the {111} planes with an increase in thickness of the silicon carbide film. FIG. 10 schematically shows the state of anti-phase boundaries for the case in which a silicon carbide film has been formed at a certain thickness. In FIG. 10, reference numeral 101 and 102 are silicon carbide single crystal layers, 103 and 105 are anti-phase boundaries along the (111) plane, and 104 and 106 are anti-phase boundaries along the (−1-111) plane.

In the silicon carbide single crystal layers 101 and 102, the sites of carbon and silicon are exchanged. As shown in FIG. 10, the anti-phase boundaries 104 and 106, and 103 and 105 that are generated at the mono atomic height steps formed on the mutually opposing inclined planes of the undulations approach each other as the thickness of the silicon carbide single crystal layers increases, and the anti-phase boundaries 104 and 103 have already merged and been annihilated in the silicon carbide single crystal layers. Also, the anti-phase boundaries 106 and 105 merge and annihilate by further deposition of silicon carbide single crystal layers. Therefore, anti-phase domains do not exist on the surface of the silicon carbide single crystal layers deposited to a fixed thickness or greater in the above-described ideal state.

However, forming the ideal and perfect mono atomic height steps and the like described above on the surface of a silicon single crystal substrate having a diameter of 3 to 8 inches is very difficult, and considering mass production and the like, such an ideal situation is nearly impossible. When the undulations are formed by mechanical grinding or the like, the configuration becomes one that lacks continuity and is disconnected in the direction of undulation ridges. In such conditions, silicon carbide such as that shown in FIG. 9 cannot be grown over the entire surface of a silicon single crystal wafer with a diameter of 3 to 8 inches, the stacking order in the undulation ridges is disturbed, and anti-phase domains are formed.

In this case, the anti-phase boundaries propagate in the {1-11} planes or the {−111} planes with an increase in the thickness of the silicon carbide single crystal layer. As a result, anti-phase domains such as those shown in FIG. 7 are formed on the surface of the silicon carbide single crystal layer. Leakage current is increased and other problems occur when such a silicon carbide single crystal is employed as a substrate of semiconductor devices.

With the above-described circumstances in view, it is an object of the present invention to provide a process for producing a silicon carbide single crystal that is capable of producing a silicon carbide single crystal which further reduces anti-phase boundaries and other planar defects, in which the density of planar defects is sufficiently low, and which can be used as a substrate of semiconductor devices.

Means of Solving the Problems

In order to accomplish the aforesaid objects, the following aspects are disclosed in relation to the present invention.

Specifically, a first major aspect of the present invention is a process for producing a silicon carbide single crystal in which a silicon carbide single crystal layer is homo-epitaxially or hetero-epitaxially grown on a surface of a single crystal substrate, wherein a plurality of undulation ridges are aligned in a specific direction; and the ridges undulate in the specific direction so as to connect planar defects such as anti-phase boundaries and/or twin bands by a merge or annihilation mechanism.

A second aspect of the present invention is the process for producing a silicon carbide single crystal of the first aspect, wherein the peak-peak period and the peak-valley height along/orthogonal to the undulation ridges constitute relationships such as those described below; when a silicon carbide single crystal is homo-epitaxially or hetero-epitaxially grown on the single crystal substrate, the density of the twin-bands and/or the anti-phase boundaries that extend along the undulation ridges on the surface of the silicon carbide single crystal layer reach saturation at a specific film thickness; and the density of the twin bands and/or the anti-phase boundaries that are orthogonal to the undulation ridges decreases thereafter as the thickness of the silicon carbide single crystal layer further increases.

A third aspect of the present invention is the process for producing a silicon carbide single crystal of the first aspect, wherein the peak-peak period and the peak-valley height along/orthogonal to the undulation ridges constitute relationships such as those described below; when a silicon carbide single crystal is homo-epitaxially or hetero-epitaxially grown on the single crystal substrate, the anti-phase domains on the surface of the silicon carbide single crystal layer expand in the orthogonal direction of the undulation ridges to form stripe areas; and then the occupancy of the anti-phase domains on the surface of the silicon carbide single crystal layer and/or the occupancy of the twin bands decrease with an increase in the thickness of the silicon carbide single crystal layer.

A fourth aspect of the present invention is the process for producing a silicon carbide single crystal of the first aspect, wherein the peak-peak period along the undulation ridges is 100 to 700 times greater than that of the period in the orthogonal direction to the undulation ridges, and the value obtained by dividing the peak-peak period by the peak-valley height along the undulation ridges is 60 to 700.

The fifth aspect of the present invention is the process for producing a silicon carbide single crystal of the fourth aspect, wherein the peak-peak period along the undulation ridges is in a range of 0.2 to 0.7 mm.

A sixth aspect of the present invention is the process for producing a silicon carbide single crystal of any of the first to fifth aspects, wherein the single crystal substrate is a silicon single crystal.

EFFECT OF THE INVENTION

In accordance with the aspects described above, it is possible to produce a silicon carbide single crystal which can be used as a substrate of semiconductor devices and in which the density of the planar defects on a single crystal is sufficiently low.

BEST MODE FOR CARRYING OUT THE INVENTION

Embodiments of the present invention are described in detail below mainly for the case in which the target film formation substrate is a silicon single crystal and planar defects are anti-phase boundaries.

FIG. 1 is a diagram showing a silicon single crystal substrate used in the process for producing a silicon carbide single crystal according to the embodiments of the present invention. FIG. 2 is a diagram showing anti-phase domains of the surface of a silicon carbide single crystal layer for the case in which a silicon carbide single crystal layer having a fixed thickness is formed on the silicon single crystal substrate shown in FIG. 1. FIG. 3 is a diagram showing a cross section along the lines AA' and BB' shown in FIG. 2. FIG. 4 is a diagram showing the state of atomic level height steps in the silicon single crystal substrate used in the process for producing silicon carbide according to the embodiments of the present invention. The process for producing the silicon carbide single crystal of the embodiments of the present invention is described below with reference to the accompanying drawings.

The process for producing the silicon carbide single crystal according to the embodiments of the present invention is a method for obtaining a silicon carbide single crystal layer having a lower defects density over the entire surface of the substrate with a grown layer by forming a 2D structure of undulations on the surface of the silicon carbide single crystal substrate. In this embodiment, anti-phase domains are eliminated by efficiently canceling out at the junctions of two types of anti-phase boundaries that are propagated parallel to the (1-11) and (-111) planes. Specifically, the anti-phase boundaries that propagate in a different direction that these two types are efficiently made to merge and be annihilated by providing a 2D structure of undulations on the surface of the silicon single crystal substrate In FIG. 1, reference numeral 1 is a silicon single crystal, and 2 is an undulation ridge. As shown in the diagram, the structure is one in which undulation ridges are aligned in a specific direction, and the ridges undulate in the thickness direction of the substrate (the normal direction of the substrate surface), i.e., a 2D structure of undulations is provided.

In such a structure, the undulation ridges are different from a conventional structure of undulations whose ridges are aligned in a single direction (a structure of ridges that does not have "undulations"), and the structure has thickness variation (i.e., the normal direction of the average plane of the surface) in the silicon single crystal substrate 1. Such a 2D structure of undulations is specified by the peak-peak periods and peak-valley heights in the ridge direction and in the cross-ridge direction simultaneously. These peak-peak periods and peak-valley heights have the shape of undulations or an undulating shape, and these assume a single value when the shape is a simple sine-wave. In the case of common shapes, however, the shapes are expressed as Fourier series but not as single sine-wave.

FIG. 1 shows an example of the undulations having a sine-wave form. In this case, the peak-peak period of the undulations in the cross-ridge direction may be about 0.01 µm to 1 mm in the same manner as the structure of the conventional one-dimensional undulations described above, and a range of 0.1 µm to 10 µm is particularly advantageous. In addition, the peak-valley height of the undulations in the cross-ridge direction may be about 1 nm to 50 µm, and a range of 10 nm to 100 nm is particularly advantageous. On the other hand, the peak-peak period and peak-valley height of the undulations in the ridge direction are both preferably greater than those in the cross-ridge direction as described below. FIG. 1 shows the case in which the peak-peak period and peak-valley height of the undulations in ridge direction are both greater than those aligned in the cross-ridge direction.

FIG. 2 schematically shows anti-phase domains of the surface of a silicon carbide single crystal layer for the case in which a silicon carbide single crystal layer having a fixed thickness is formed on the silicon single crystal substrate having a 2D structure of undulations shown in FIG. 1. The state of the anti-phase domains is substantially the same as the state shown in FIG. 7 described above in terms of external appearance, as shown in FIG. 2. However, the state of the anti-phase boundaries inside the silicon carbide single crystal layer is different, as described below.

FIG. 3 is a diagram showing a cross section along the lines AA' and BB' shown in FIG. 2. In the diagram, 31 and 32 are anti-phase boundaries inside the silicon carbide single crystal layer, 31 is an anti-phase domain that propagates parallel to the (1-11) plane as the thickness of the silicon carbide single crystal layer increases, and 32 is an anti-phase domain that propagates parallel to the (-111) plane. As shown by the cross section AA', nearly all of the anti-phase boundaries that propagate parallel to the (111) and (-1-11) planes merge and annihilate along the cross-ridge direction, and the anti-phase domains are eliminated in the vicinity of the surface of the silicon carbide film.

As shown by the cross section BB', the anti-phase boundaries 32 and 33 that propagate parallel to the (1-11) and (-111) planes have not yet merged and been completely annihilated in the ridge direction, and anti-phase domains therefore exist in the surface of the silicon carbide film. The reason that the cross sections AA' and BB' differ in this manner is that the peak-peak period and peak-valley height of the undulations in the ridge direction are both greater than those in the cross-ridge direction. Nevertheless, the densities of anti-phase boundaries that propagate parallel to the (1-11) and (-111) planes are equal due to the existence of "undulations," and counter anti-phase boundaries therefore merge and are annihilated by further deposition of a silicon carbide film. Therefore, a silicon carbide single crystal film that does not contain anti-phase domains can be obtained at a certain fixed thickness.

Next, in the 2D structure of undulations according to the present invention, the peak-peak period and peak-valley height of the undulations are described with reference to FIG. 4 for the case in which the peak-peak period and peak-valley height of the undulations in the ridge direction are about the same as those in the cross-ridge direction. FIG. 4 is a schematic diagram showing the state of atomic level height steps in the silicon single crystal substrate on which a 2D structure of undulations has been fabricated. In FIG. 4, reference numerals 41, 42, 43, and 44 are terraces (flat portions) on the surface of a silicon single crystal substrate; and 411, 412, 421, 422, 431, 432, 441, and 442 are edges of the steps (stepped portions).

Described below is the case in which a silicon carbide single crystal layer is grown by a step flow mode on the silicon single crystal substrate described above. The anti-phase boundary generated at the edge of each step propagates in directions that are crystallographically equivalent to the (111) plane. In this case, the anti-phase boundaries do not merge and annihilate, but the anti-phase boundaries remaining until the end of the process are anti-phase boundaries that are generated at the edges of 411, 412, 421, 422, 431, 432, 441, and 442. These anti-phase boundaries merge and are annihilated by continuing to further grow the silicon carbide single crystal layer. That is to say, the anti-phase boundary generated at the edge 411 merges and annihilates with the anti-phase boundary generated at the edge 421, and the anti-phase boundary generated at the edge 412 merges and annihilates with the anti-phase boundary generated at the edge 442. The same applies to the anti-phase boundaries generated at the edges 422, 432, 431, and 441. After all of the anti-phase boundaries merge and are annihilated, the silicon carbide single crystal layer obtained in the thickness greater than that described above does not contain anti-phase domains.

As described above, ideal terraces or steps with the atomic level height are formed on the surface of a silicon single crystal substrate or the target film formation substrate, and if the growth with step-flow mode for the silicon carbide film is carried out, the anti-phase domains can be annihilated by causing the anti-phase boundaries to merge and annihilate even if the peak-peak period and peak-valley height of the undulations in the ridge direction are the same as those in the cross-ridge direction. In practice, however, it is very difficult to realize such an ideal state. Specifically, when the peak-peak period and peak-valley height of the undulations in the ridge direction are the same as those in the cross-ridge direction, a greater number of the atomic level height steps are introduced to the surface of the silicon single crystal substrate by fabricating undulations in comparison with the case in which the peak-peak period and peak-valley height of the undulations in the ridge direction are greater than those in the cross-ridge direction. These steps produce excess anti-phase boundaries, and it is therefore preferable to minimize the number of steps on the substrate. In this sense, it is preferred that the peak-peak period and peak-valley height of the undulations in the ridge direction be greater than those in cross-ridge direction.

Twin bands as planar defects together with anti-phase boundaries exist in the silicon carbide single crystal layer that is actually obtained. Twin bands generated from the atomic level height steps introduced by fabricating undulations also propagate parallel to the {111} planes as the silicon carbide single crystal layer is grown in the same manner as the anti-phase boundaries. In the case of the twin bands, it is rare that the bands merge and are annihilated, as described below, and one of the counter bands remains and continues propagating in the {111} planes. It is therefore critically important to reduce to the extent possible the number of atomic level height steps introduced by fabricating the 2D undulations, and in this sense the peak-peak period and peak-valley height of the undulations in the ridge direction are preferably greater than those in the cross-ridge direction.

FIG. 11 is a diagram that schematically shows the state in which a silicon carbide film has been formed on a silicon single crystal substrate on which undulations have been formed. In the diagram, reference numeral 111 is a silicon carbide film, 112 is a twin band that propagates parallel to the (111) plane, 113 is a twin band that propagates parallel to the (−1-11) plane, and 114 and 115 are atomic level height steps. It is rare for twin bands to merge and be annihilated, as shown in FIG. 11. One of the twin bands remains after merging, and keeps propagating in the direction parallel to either the (−1-11) plane or the (111) plane as the silicon carbide film is grown thereafter. The state of the step 92 introduced to the surface of the silicon single crystal substrate 81 and the growth state of the silicon carbide film determine in which of these two directions the remaining twin band will keep propagating.

As long as the number of downstairs 114 is equal to that of upstairs 115 within a single undulation; that is, in an ideal case, the number of twin bands remaining in the undulation is one (1) when the thickness of the silicon carbide film 111 reaches a fixed value or higher.

However, it is not easy to realize an ideal state in which the number of steps in the two directions described above is the same in microscopic view, even if the number of upstairs and downstairs is the same in macroscopic view, although this also depends on the method used to form undulations. In such a case, the number of twin bands that remains per single period is greater than 1. Therefore, the number of steps with an atomic level height to be introduced is preferably a small number from the aspect of reducing the number of twin bands.

Systematic study into the effect of the relationship between the peak-peak period and peak-valley height along/orthogonal to undulation ridges on the reduction of planar defects has revealed that the planar defects can be most effectively reduced when the following relationship is satisfied. Specifically, when the peak-peak period and peak-valley height of the undulations in the cross-ridge direction are both less than those in the ridge direction, planar defects can be effectively reduced. This reduction rate of planar defects can be maximized with a relationship that the anti-phase domains expand in the cross-ridge direction to form stripe domains at a specific layer thickness, and those are then annihilated with increasing layer thickness.

As used herein, the term "striped domains" ideally refers to a state such as that shown in FIG. 2 or FIG. 7, the anti-phase domains do not necessarily need to be perfectly continuous in the cross-ridge direction, and it is enough that a single anti-phase domain extend in the cross-ridge direction than in the ridge direction. Such a relationship between the peak-peak period and peak-valley height of undulations in the ridge and cross-ridge directions can be expressed in the following manner in terms of the number of anti-phase boundaries and/or twin bands per unit area.

In other words, the most effective reduction of planar defects can be realized with the following conditions: The peak-peak period and peak-valley height of the undulations in the cross-ridge direction are less than those in the ridge direction; the number of anti-phase boundaries and/or twin bands per unit surface area in the ridge direction on the surface of the silicon carbide single crystal layer has shown a tendency to saturate with increasing thickness when the silicon carbide single crystal layer is formed; and thereafter the number of anti-phase boundaries and/or twin bands per unit surface area in the cross-ridge direction decreases as the thickness of the film increases further.

In this case, the phrase "tendency to saturate" refers to a situation in which the absolute value of the differential coefficient, which corresponds to the thickness of the silicon carbide single crystal layer, of the number of anti-phase boundaries and/or twin bands per unit surface area shows a tendency to decrease in the relationship between the thickness of the silicon carbide single crystal film and the number of anti-phase boundaries and/or twin bands per unit surface area, and does not necessarily refer to a situation in which the number of anti-phase boundaries and/or twin bands per unit surface area assumes a fixed value without any dependence on the thickness of the silicon carbide film. Specifically, when the peak-peak period in the ridge direction is 100 to 700 times greater than that in the cross-ridge direction and the value obtained by dividing the peak-peak period by the undulation peak-valley height is in a range of 60 to 700, the effect of reducing planar defects caused by fabricating undulations is made more drastic, and when the peak-peak period of undulation in the ridge direction is furthermore 200 to 650 times greater than that in the cross-ridge direction and the value obtained by dividing the peak-peak period by the undulation peak-valley height is in a range of 80 to 650, the effect of reducing planar defects is even more drastic.

EXAMPLES

The present invention is described in detail below using examples. In the description below, a method in which a substrate having conventional unidirectional undulations is used is described as a comparative example, and examples of the present invention will be subsequently described.

Comparative Example

Undulations extending substantially in the <1-10> directions were formed by a mechanical polishing method described below on the surface of a Si(001) substrate having an 8-inch diameter. Commercially available polishing agent and cloth were used to form the undulations, i.e., a diamond slurry composed of diamond particles having a diameter of about 9 μm (Hyprez manufactured by Engis), and a polishing cloth (Engis M414). The polishing cloth was uniformly sintered with the diamond slurry, and the Si(001) substrate was placed on a pad and was reciprocated 300 times over the polishing cloth in the <1-10> directions for a distance of about 20 cm while applying a pressure of 0.2 kg/cm$^2$ to the entire Si(001) substrate. Substantially innumerable polishing scratches (undulations) in the <1-10> directions were formed on the surface of the Si(001) substrate.

Since diamond particles and the like had remained on the surface of the polished Si(001) substrate, the substrate was cleaned using an ultrasonic cleaner, and thereafter cleaned using a mixed solution of a hydrogen peroxide solution and sulfuric acid (1:1) and diluted hydrofluoric acid. A large number of defects and thin spike-shaped concavities and convexities remained on the surface of the cleaned substrate in addition to the desired undulations, and the substrate could not be used as a target film formation substrate. In view of this situation, a thermal oxidation film was formed after cleaning to a thickness of about 1 μm on the substrate on which undulations had been fabricated, and the thermal oxidation film as a sacrificial layer was thereafter removed with the aid of diluted hydrofluoric acid. The surface of the Si(001) substrate was etched about 200 nm by using a series of steps composed of thermal oxidation film formation and etching removal. As a result, the thin concavities and convexities were removed and very smooth wave-like undulations were successfully obtained. The peak-peak period in the cross-ridge direction was 1 to 2 μm, the peak-valley height thereof was 30 to 50 nm, and the slope angle of the incline of the cross-ridge direction was 3 to 5°.

A silicon carbide single crystal layer (hereinafter referred to as "3C—SiC") was formed by vapor-phase deposition on the Si(001) substrate on which undulations had been fabricated. The growth of the 3C—SiC was divided into a step of carbonizing the Si(001) substrate and a step of growing silicon carbide by alternately feeding source gases. In the carbonization step, the substrate temperature was elevated from room temperature to 1,300° C. during 120 minutes in an acetylene environment. After the carbonization step, the surface of the substrate was alternately exposed to dichlorosilane and acetylene at 1,300° C. to grow silicon carbide. TABLE 1 shows the detailed conditions of the carbonization step, and TABLE 2 shows the detailed conditions of the step for growing silicon carbide.

TABLE 1

| | |
|---|---|
| Carbonizing temperature | 1,300° C. |
| Acetylene flow rate | 30 sccm |
| Pressure | 60 mTorr |
| Temperature elevating time | 120 minutes |

TABLE 2

| | |
|---|---|
| Growth temperature | 1,300° C. |
| Source gas supply method | Alternate supply of acetylene and dichlorosilane |
| Acetylene flow rate | 30 sccm |
| Dichlorosilane flow rate | 300 sccm |
| Supply interval of each gas | 3 seconds |
| Supply time of each gas | 4 seconds |
| Maximum pressure | 100 mTorr |
| Minimum pressure | 10 mTorr |

The 3C—SiC was dipped for 5 minutes in molten KOH at 500° C. and etched, and the state of the planar defects of the resulting 3C—SiC was thereafter evaluated by using an optical microscope to measure the number of etched-lines per unit surface area generated in the surface. The anti-phase boundaries were observed as lines and the twin bands were observed as bands on the surface on the 3C—SiC. Therefore, when etched using the method described above, the anti-phase boundaries and twin bands were observed as etched-lines in the portions in which these boundaries and bands were present. The planar defects composed of anti-phase boundaries and twin bands introduced to the 3C—SiC could therefore be quantitatively evaluated by determining the number of etched-lines per unit surface area. As expected, the anti-phase boundaries and twin bands could not be distinguished using only this method, but the effect of the present invention was to reduce these two defects, and in this sense the evaluation method described herein was adequate.

FIG. 13 shows the dependency of the etched-lines density in the ridge direction, that is, <1-10> direction, and in the cross-ridge direction, as well as the dependency of a sum of both etched-line densities, on the thickness of a 3C—SiC film grown on the Si(001) substrate. In the diagram, the symbols ○, □ and ▲ represent the values obtained in the experiment, and the lines connecting these symbols are straight lines that connect the series of values obtained in the experiments. As shown in the diagram, the density of the etched-lines in the ridge direction was rapidly reduced with an increase in the thickness of the 3C—SiC film due to the annihilation that was enhanced by undulations, and the density was $1\times10^3$ etched-lines/cm$^2$ or less at a thickness of 100 μm or more. On the other hand, although a slight tendency for the density to decrease in the cross-ridge direction was observed as the thickness of the 3C—SiC increased, the density was at $9\times10^5$ etched-lines/cm$^2$ at a thickness of 400 μm.

Example 1

Undulations whose ridges were aligned in the <1-10> directions, that is, the ridge direction, were fabricated on the surface of a Si(001) substrate using the same method as that described in the comparative example, and additional undulations with peaks and valleys arranged in the <110> directions were thereafter fabricated by dry etching using a stencil mask described below. FIG. 12 schematically shows the relative relationship between the stencil mask and the undulations in the <1-10> directions during dry etching. In FIG. 12, reference numeral 121 is a Si(001) substrate on which undulations have been fabricated, 122 are formed undulations, 123 is a stencil mask, and 124 is a rectangular aperture formed in the stencil mask. As shown in the diagram, the Si(001) substrate 121 and the stencil mask 123 are disposed so that the lengthwise direction of the rectangular pattern 124 is orthogonal to the ridge direction of undulations 122. Reactive ion etching that uses a mixed gas composed of $CF_4$ and oxygen was used as the dry etching method. TABLE 3 shows the etching conditions.

TABLE 3

| | |
|---|---|
| Gas flow rates | $CF_4$ (40 sccm), $O_2$ (10 sccm) |
| Gas pressure | 10 Pa |
| RF input power | 250 W |

A gap of 0.1 to 0.2 mm was provided between the stencil mask 123 and the Si(001) substrate 121 during etching.

In accordance with the method described above, Si(001) substrates were formed in which the peak-valley height was 1 μm and the peak-peak periods were 0.1 mm, 0.2 mm, 0.4 mm, 0.6 mm, 0.8 mm, and 1.2 mm. In the fabrication of Si(001) substrates having different peak-peak periods, stencil masks 123 having a different peak-valley height and peak-peak period in the aperture 124 were used, and the undulation peak-valley height was controlled by changing the etching time.

TABLE 4 and FIG. 14 show the dependency of the etched-line density on the peak-peak period in the ridge direction for the case in which a 3C—SiC was formed to a thickness of 400 μm under the same conditions as the comparative example on a Si(001) substrate on which undulations in the ridge direction and the cross-ridge direction had been fabricated. The numerical data shown in TABLE 4 is plotted in FIG. 14. In the diagram, the symbol ○ represents the values obtained by experimentation, and the lines connecting these symbols are straight lines that connect the series of values obtained in the experiments. The density of the etched-lines shown in the table and diagram is the summation of the densities of the etched-lines in two directions, i.e., the ridge direction and the cross-ridge direction. In either case, the undulation peak-valley height was constant at 1 μm, and the peak-peak period, peak-valley height, and slope angle of the inclined plane of the undulations in the cross-ridge direction were the same as the comparative example, and the values were 1 to 2 μm. 30 to 50 nm, and 3 to 5°, respectively.

TABLE 4

| | |
|---|---|
| 0.1 mm | $2.5 \times 10^5$ etched-lines/cm$^2$ |
| 0.2 mm | $1 \times 10^5$ etched-lines/cm$^2$ |
| 0.4 mm | $2 \times 10^4$ etched-lines/cm$^2$ |
| 0.6 mm | $1 \times 10^4$ etched-lines/cm$^2$ |
| 0.8 mm | $2 \times 10^5$ etched-lines/cm$^2$ |
| 1.2 mm | $6 \times 10^5$ etched-lines/cm$^2$ |

As shown in TABLE 4 or FIG. 14, fabricating undulations on the surface of the substrate in a peak-peak period in the ridge direction range of 0.1 to 1.2 mm yielded an etched-line density that was less than $9\times10^5$ etched-lines/cm$^2$, which was the value of the etched-line density of the comparative example in which undulations had not been fabricated. In a peak-peak period range of 0.2 to 0.7 mm in particular, the value of the etched-line density was $1\times10^5$ etched-lines/cm$^2$ or less, and the effect of reducing the density of planar defects was made more drastic by fabricating undulations on the surface of the substrate. Considering the fact that the peak-peak period in the cross-ridge direction is 1 to 2 μm and the undulation peak-valley height is 1 μm, it is apparent that when the peak-peak period in the ridge direction is 100 to 700 times greater than that in the cross-ridge direction, and when the value obtained by dividing the peak-peak period by the peak-valley height is in a range of 200 to 700, the effect of reducing planar defects is made more drastic.

FIGS. 15 and 16 show the dependency of the etched-line density in two directions on the 3C—SiC thickness, i.e., the ridge direction and the cross-ridge direction, as well as the total of these two directions, for the case in which the peak-peak period was 0.4 mm as an example in which the effect of reducing planar defects was made drastic by fabricating undulations, and for the case in which the peak-peak period was 0.1 mm as an example in which the effect of reducing planar defects was not drastic. When the peak-peak period was 0.4 mm, the etched-line density in the ridge direction rapidly decreased as the thickness of the 3C—SiC increased, and the value of the density was $1\times10^3$ etched-lines/cm$^2$ when the thickness was 100 μm. The density tended to saturate at a thickness of 100 μm or more.

In contrast, the etched-line density in the cross-ridge direction was substantially constant at a value of $4\times10^5$ etched-lines/cm$^2$ until a 3C—SiC thickness of 100 μm was reached, and the density began to decrease at a thickness greater than the above-stated value, i.e., the thickness at which the etched-line density value in the ridge direction begins to show a tendency to saturate, or a greater thickness. The density was $2\times10^4$ etched-lines/cm$^2$ at a thickness of 400 μm. The etched-line density dependency on the 3C—SiC thickness was also observed for the cases in which the peak-peak period of the undulations was 0.2 mm and 0.6 mm.

On the other hand, when the peak-peak period in the ridge direction was 0.1 mm, the etched-line density in the ridge direction decreased as the thickness of the 3C—SiC film increased, and the density was $1\times10^3$ etched-lines/cm$^2$ when the thickness was 200 μm. The density tended to saturate at a thickness of 200 μm or more. In contrast, the etched-line density in the cross-ridge direction began to gradually decrease from the point at which the thickness of the 3C—SiC film was 40 μm, the reduction rate of etched-lines saturated when the thickness reached 100 μm, and the value remained high at $2.5\times10^5$ etched-lines/cm$^2$ at a thickness of 400 μm. The same 3C—SiC dependency of the etched-line density on thickness was also observed for the cases in which the peak-peak period of the undulations in the cross-ridge direction was 0.8 mm and 1.2 mm.

Based on the results above, when the peak-peak period and peak-valley height of the undulations in the cross-ridge direction are both less than those in the ridge direction, it was observed that the planar defects can be most effectively reduced when the two have the following relationship. That is, after the etched-line density in the ridge direction saturates as a function of thickness when the silicon carbide film is grown, the etched-line density in the cross-ridge direction decreases as the thickness of the film increases further.

Example 2

Next, undulations with ridges extending in the <1-10> direction were formed on the surface of a Si(001) substrate using the same method as that described in the example 1, and a Si(001) substrate was fabricated in which the peak-peak period in the ridge direction was constant at 0.4 mm and the peak-valley height in the ridge direction was varied, i.e., 0.2 µm, 0.5 µm, 1 µm, 5 µm, and 10 µm. The undulation peak-valley height was controlled by adjusting the duration of the etching process.

TABLE 5 and FIG. 17 show the etched-line density as a function of the peak-valley height in the ridge direction for the case in which a 3C—SiC was formed to a thickness of 400 µm under the same conditions as the comparative example on a Si(001) substrate on which undulations had been fabricated. The numerical data shown in TABLE 5 is plotted in FIG. 17. In the diagram, the symbol ○ represents the values obtained by experimentation, and the lines connecting these symbols are straight lines that connect the series of values obtained in the experiments. The density of the etched-lines shown in the table and diagram is the summation of the densities of the etched-lines in two directions, i.e., the ridge direction and cross-ridge direction. In either case, the peak-peak period in the ridge direction was constant at 0.4 mm; the peak-peak period, peak-valley height, and slope angle of the inclined plane of the undulations in the cross-ridge direction were the same as the comparative example; and the values were 1 to 2 µm, 30 to 50 nm, and 3 to 5°, respectively.

TABLE 5

| | |
|---|---|
| 0.2 µm | $6 \times 10^5$ etched-lines/cm$^2$ |
| 0.5 µm | $6 \times 10^5$ etched-lines/cm$^2$ |
| 1 µm | $2 \times 10^4$ etched-lines/cm$^2$ |
| 5 µm | $4 \times 10^4$ etched-lines/cm$^2$ |
| 10 µm | $7 \times 10^5$ etched-lines/cm$^2$ |
| 15 µm | $4 \times 10^5$ etched-lines/cm$^2$ |

As shown in TABLE 5 or FIG. 17, fabricating undulations on the surface of the substrate whose undulation peak-valley height in the ridge direction was within a range of 0.2 to 15 µm yielded an etched-line density that was less than $9 \times 10^5$ etched-lines/cm$^2$, which was the value of the etched-line density of the comparative example in which undulations in the ridge direction had not been fabricated. In an undulation peak-valley height in the ridge direction range of 1 to 5 µm in particular, the value of the etched-line density was 2 to $4 \times 10^4$ etched-lines/cm$^2$ or less, and the effect of reducing the density of planar defects was made more drastic by fabricating undulations in the ridge direction on the surface of the substrate. The results shown in FIG. 17 clearly indicate that an etched-line density value of $1 \times 10^5$ etched-lines/cm$^2$ or less was obtained with an undulation peak-valley height in a range of 0.7 to 7 µm in the ridge direction. Considering the fact that the peak-peak period in the cross-ridge direction is 1 to 2 µm while the peak-peak period in the ridge direction is 0.4 mm, it is apparent that an etched-line density value of $1 \times 10^5$ etched-lines/cm$^2$ or less can be obtained when the peak-peak period in ridge direction is 200 to 400 times greater than that in the cross-ridge direction, and when the value obtained by dividing the peak-peak period in the ridge direction by the undulation peak-valley height is in a range of about 60 to 570.

FIGS. 18 and 19 show the 3C—SiC thickness dependency of the etched-line density in two directions, i.e., the ridge direction and cross-ridge direction, as well as the total of these two directions, for the case in which the undulation peak-valley height in the ridge direction was 5 µm as an example in which the effect of reducing planar defects was made drastic by fabricating undulations in the ridge direction, and for the case in which the undulation peak-valley height was 0.2 µm as an example in which the effect of reducing planar defects was not drastic.

When the undulation peak-valley height in the ridge direction was 5 µm, the etched-line density in the ridge direction rapidly decreased as the thickness of the 3C—SiC increased, and the value of the density was $1 \times 10^3$ etched-lines/cm$^2$ when the thickness was 100 µm. The density saturated at a thickness of 100 µm or more. In contrast, the etched-line density in the cross-ridge direction was substantially constant at a value of $8 \times 10^5$ etched-lines/cm$^2$ until a 3C—SiC thickness of 100 µm was reached, and the density began to decrease at a thickness greater than the above-stated value, i.e., a thickness at which the etched-line density value in the ridge direction reached saturation. The thickness was $4 \times 10^4$ etched-lines/cm$^2$ at a thickness of 400 µm. The dependency of such an etched-line density on the 3C—SiC thickness was the same as in the case in which the undulation peak-valley height in the ridge direction was 1 µm (the results shown in FIG. 15).

On the other hand, when the undulation peak-valley height in the ridge direction was 0.2 µm, the etched-line density in the ridge direction decreased as the thickness of the 3C—SiC film increased, and the value of the density was $1 \times 10^3$ etched-lines/cm$^2$ when the thickness was 100 µm. The density saturated when the thickness was greater than 100 µm. In contrast, the etched-line density in the cross-ridge direction showed no dependency on the thickness of the 3C—SiC film, and was high at $6 \times 10^5$ etched-lines/cm$^2$. The similar dependency of the etched-line density on the 3C—SiC thickness was also observed for the cases in which the peak-valley height of the undulations was 0.5 µm, 10 µm, and 15 µm.

Based on the results above, when the peak-peak period and peak-valley height of the undulations in the cross-ridge direction are both less than those in the ridge direction, it was also observed in the present example, in the same manner as in example 1, that planar defects can be most effectively reduced when the two have the following relationship. That is, after the etched-line density in the ridge direction has saturated in relation to the increasing thickness when the silicon carbide film was grown, the etched-line density in the cross-ridge direction decreased as the thickness of the film increased further.

Examples were described above, but the present examples are no more than examples of the embodiments of the present invention. The present invention is not limited in any manner by the conditions, methods, and the like described in the examples. In particular, it is possible to use a single crystal other than a silicon carbide single crystal as the target film formation substrate of the silicon carbide single crystal layer. The same applies to the method of fabricating the undulations in the ridge direction and cross-ridge direction simultaneously. The present invention is not limited in any manner by the methods described in the present examples, and other methods may be used. The same applies to the peak-peak period and peak-valley height of the undulations, i.e., it is not required that the value be constant as in the present examples, and the same effect can be achieved if the values of the peak-peak period and peak-valley height of the undulations are distributed in a range the produces the following relationship. The fixed conditions described above, i.e., the peak-peak period and peak-valley height of the undulations in the ridge and cross-ridge directions, are in a relationship such that the number of anti-phase boundaries and/or twin bands per unit surface area in the direction in which the ridges extend in the surface of the silicon carbide single crystal layer saturates in relation to the increasing thickness when the silicon carbide single crystal is grown, and the number of anti-phase boundaries and/or twin bands in the cross-ridge direction decrease as the thickness of the film increases further.

INDUSTRIAL APPLICABILITY

The present invention can be used to produce a silicon carbide single crystal that has a low defect density or lower lattice distortions and that can be used as a semiconductor devices or other electronic material.

KEY

Figure 1:
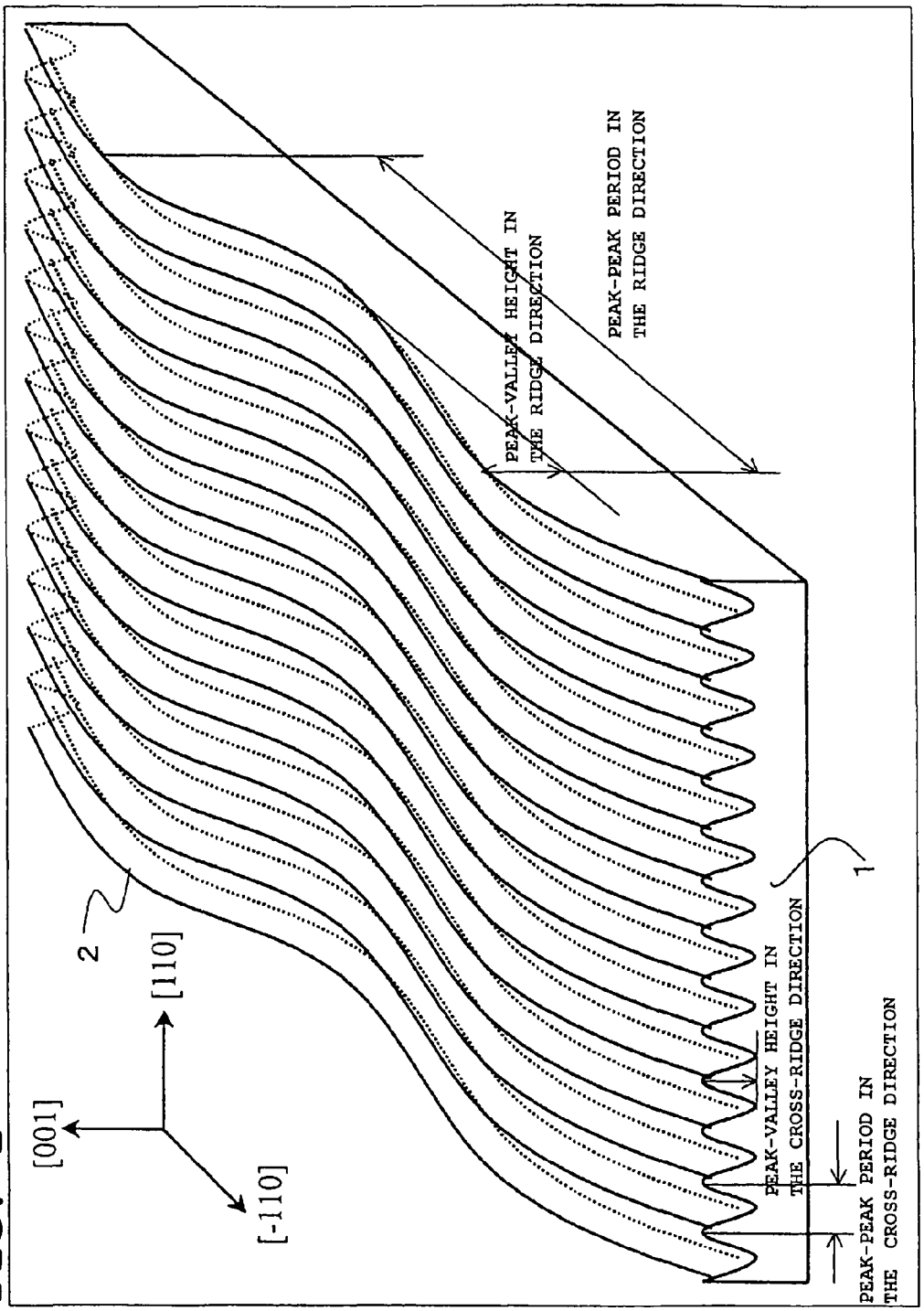
FIG. 1 is a diagram showing a silicon single crystal substrate used in the process for producing a silicon carbide single crystal according to the embodiments of the present invention.
Figure 2:
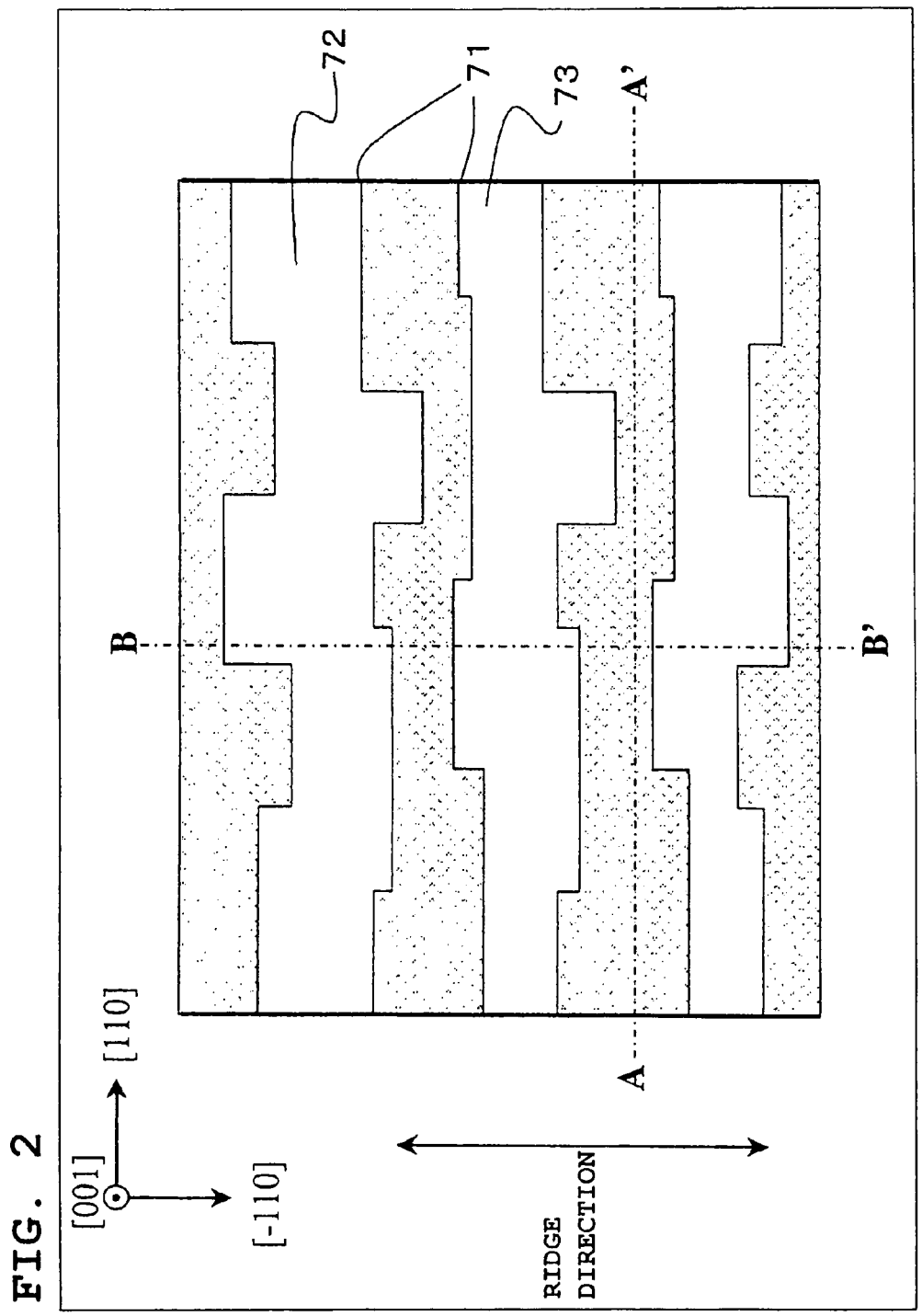
FIG. 2 is a diagram showing anti-phase domains of the surface of a silicon carbide single crystal layer for the case in which a silicon carbide single crystal layer having a fixed thickness is formed on the silicon single crystal substrate shown in FIG. 1.
Figure 3:
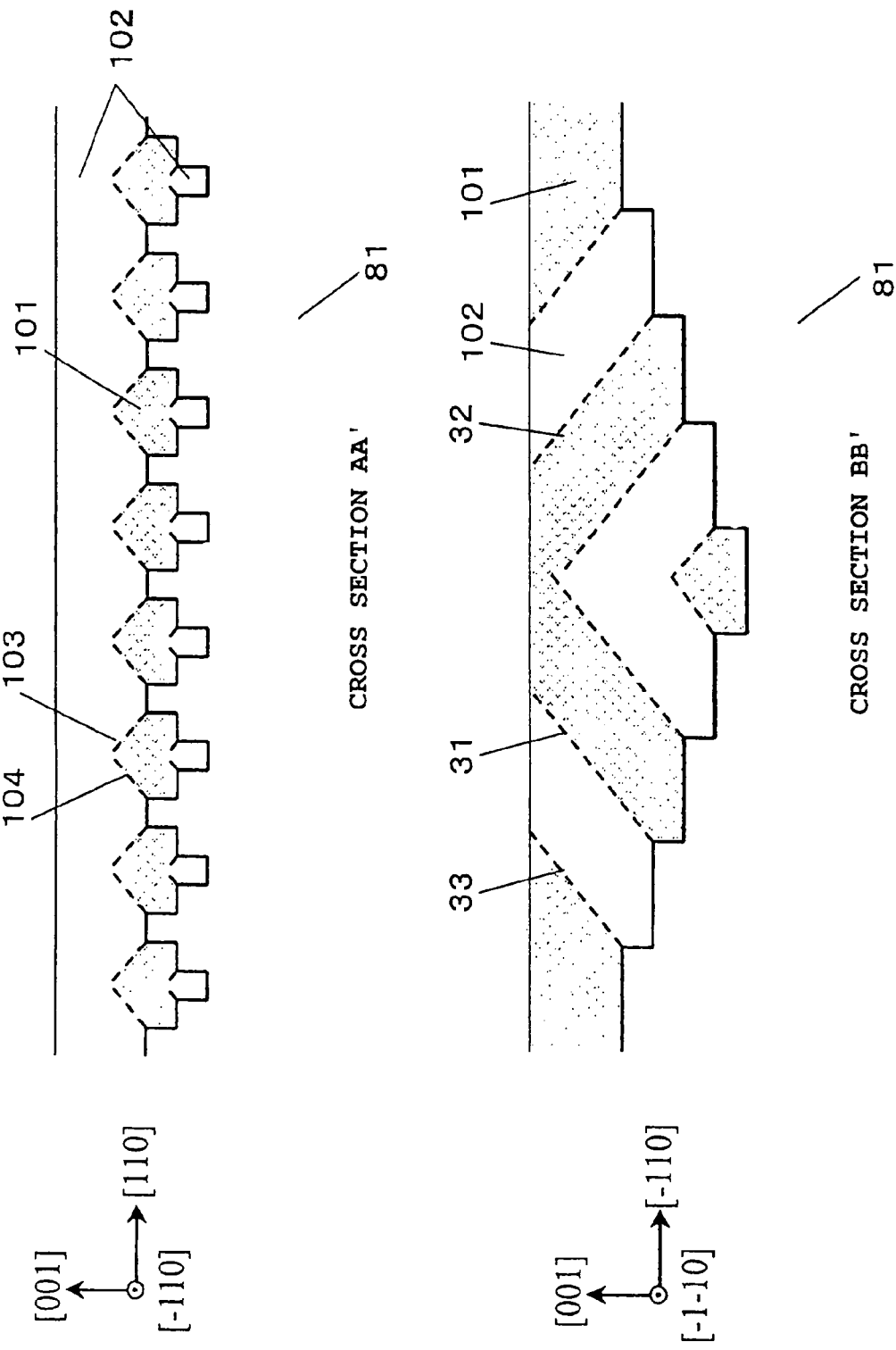
FIG. 3 is a diagram showing a cross section along lines AA' and BB' shown in FIG. 2.
Figure 4:
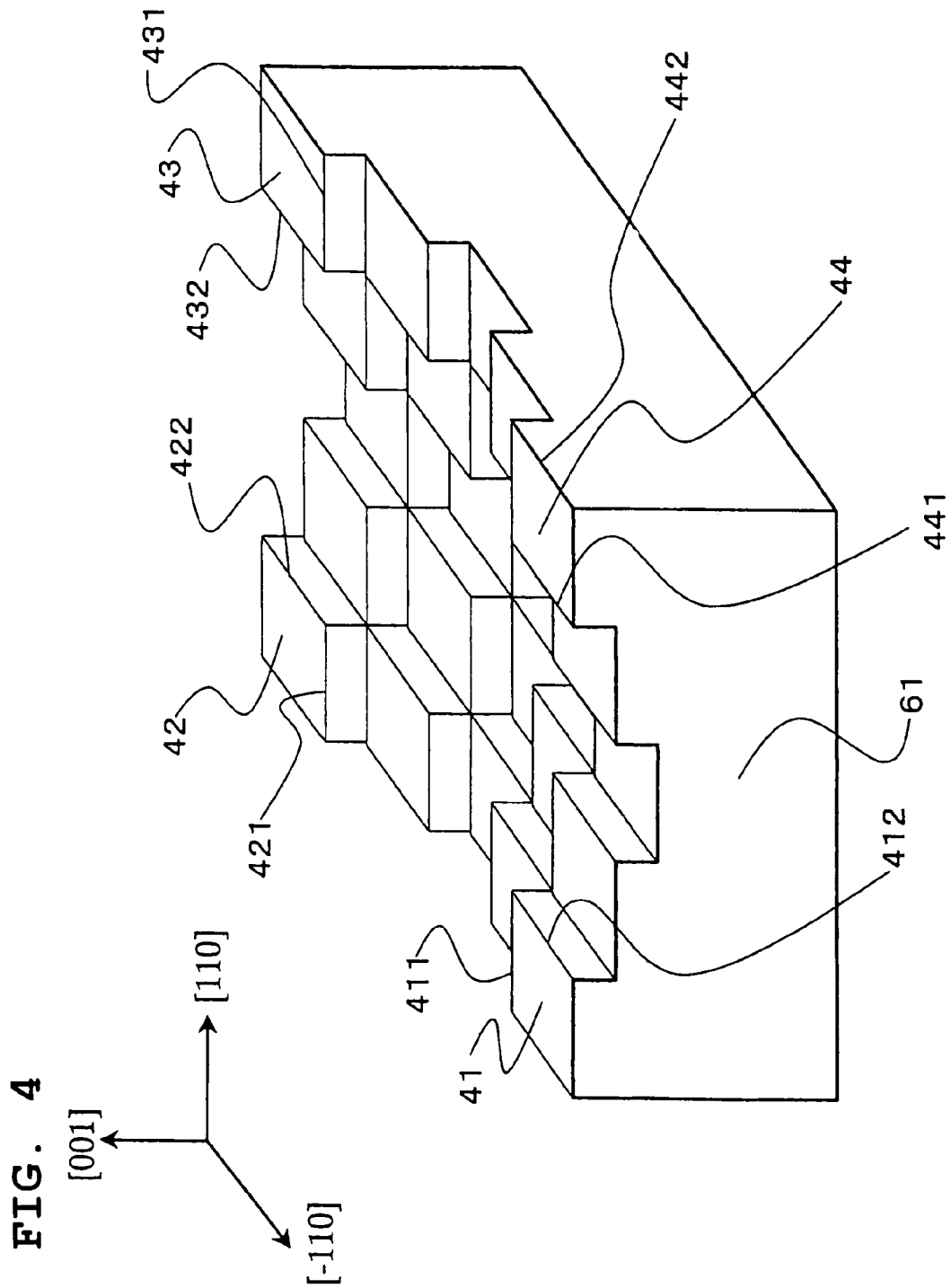
FIG. 4 is a diagram showing the state of atomic level height steps in the silicon single crystal substrate used in the process for producing silicon carbide according to the embodiments of the present invention.
Figure 5:
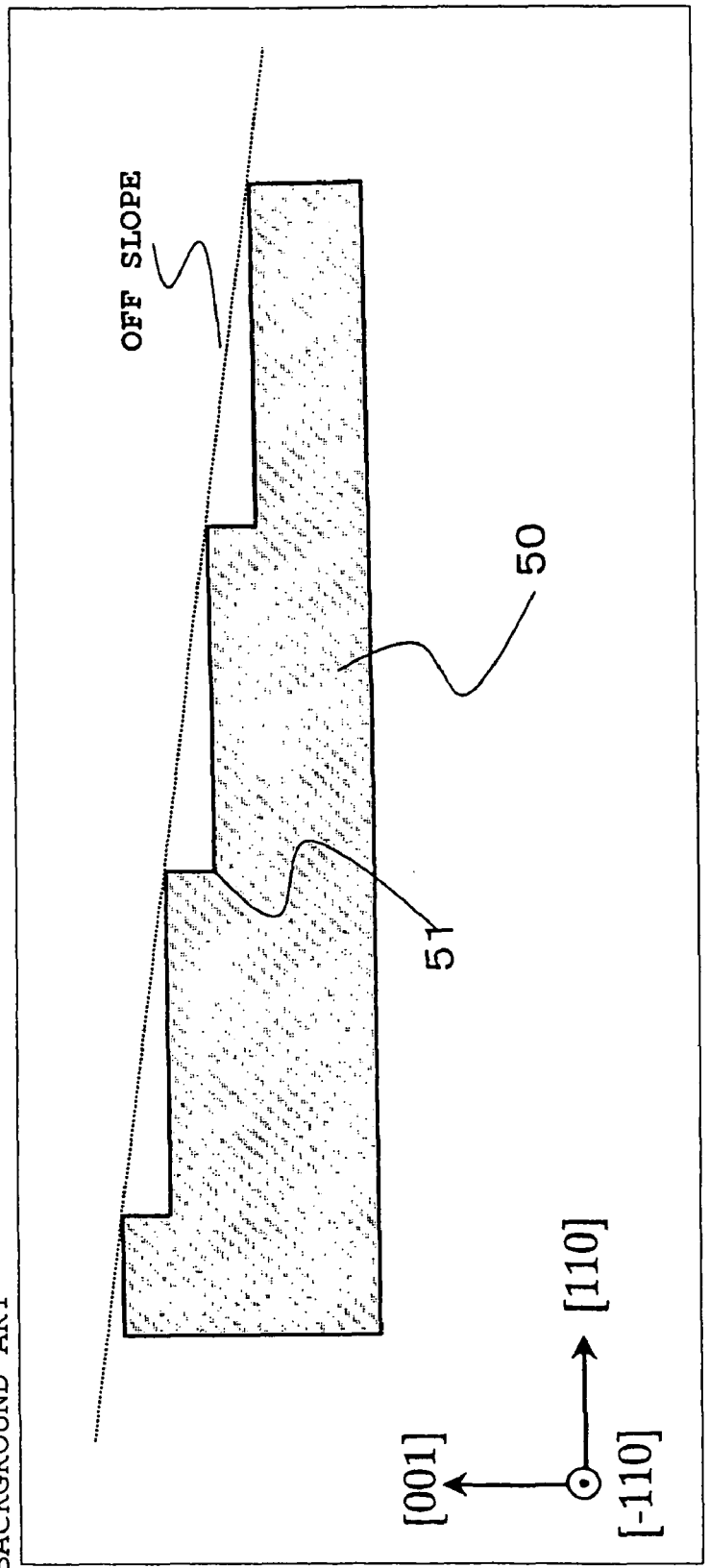
FIG. 5 is a schematic diagram showing an example of a substrate to which an off-angle has been introduced.
Figure 6:
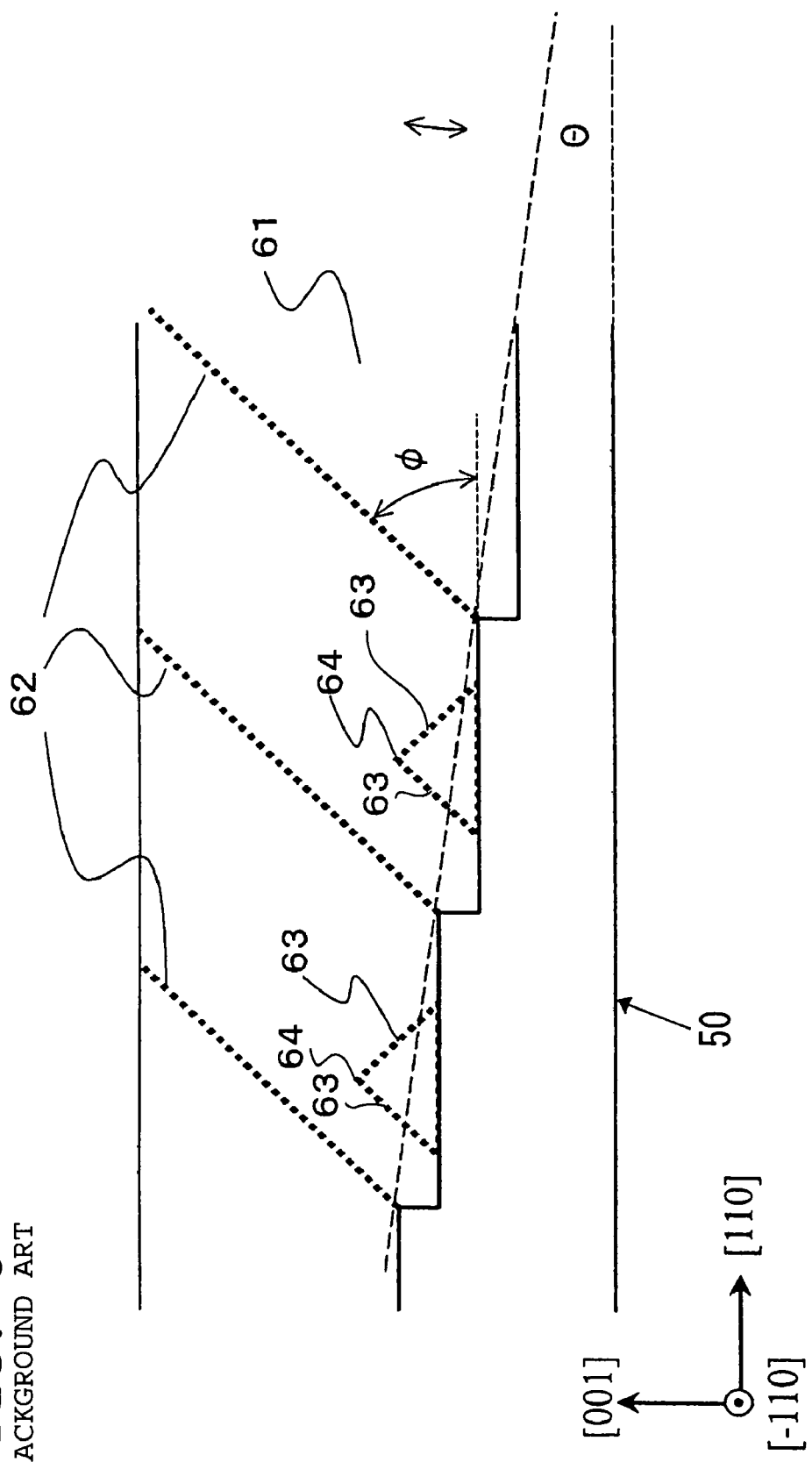
FIG. 6 is a schematic diagram showing the presence of anti-phase boundaries for the case in which a silicon carbide single crystal layer is formed at a constant thickness on an off-substrate composed of silicon single crystal.
Figure 7:
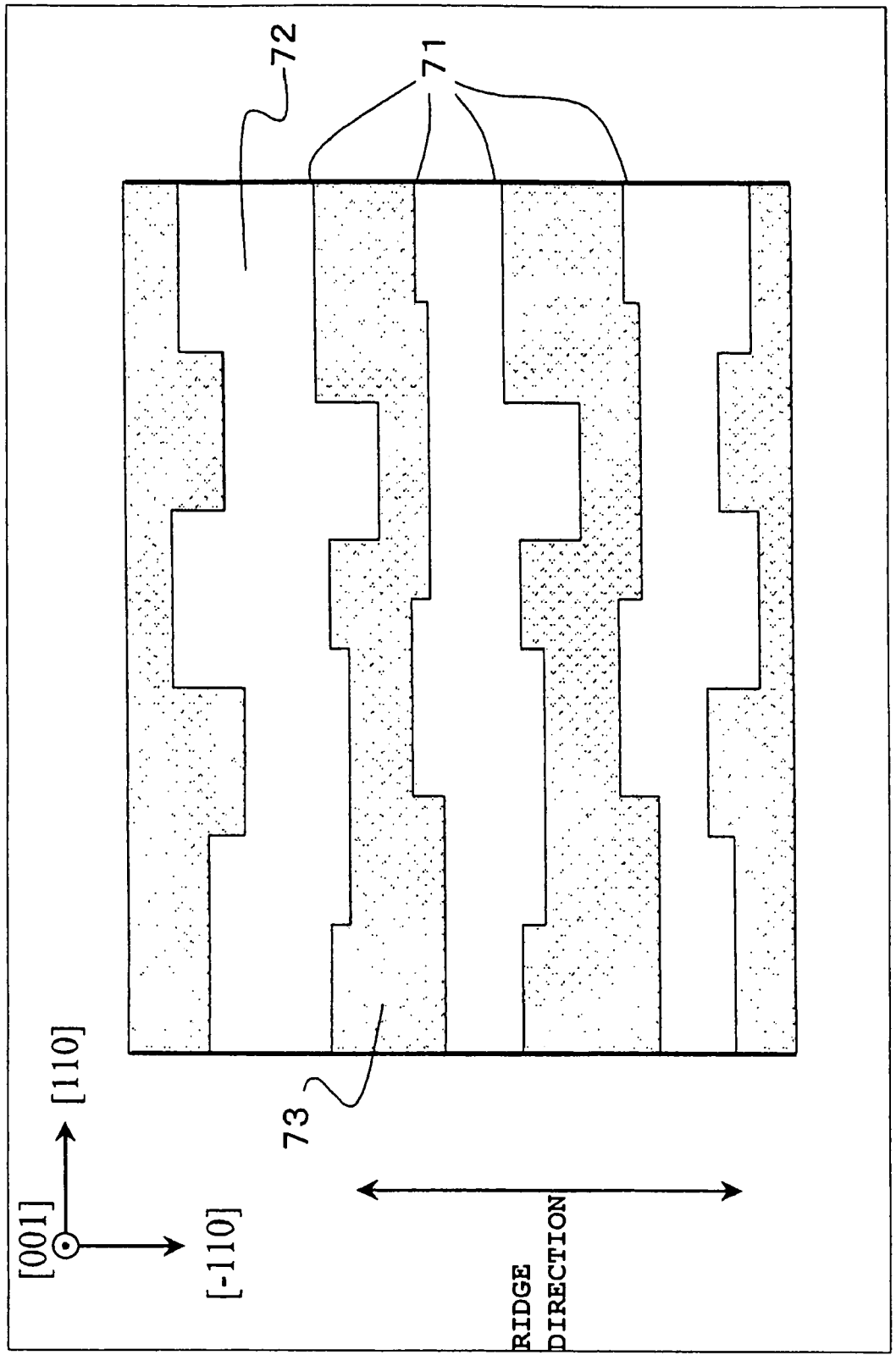
FIG. 7 is a schematic diagram showing the presence of anti-phase boundaries on the surface of a silicon carbide single crystal layer deposited on a silicon single crystal substrate on which undulations have been formed.
Figure 8:
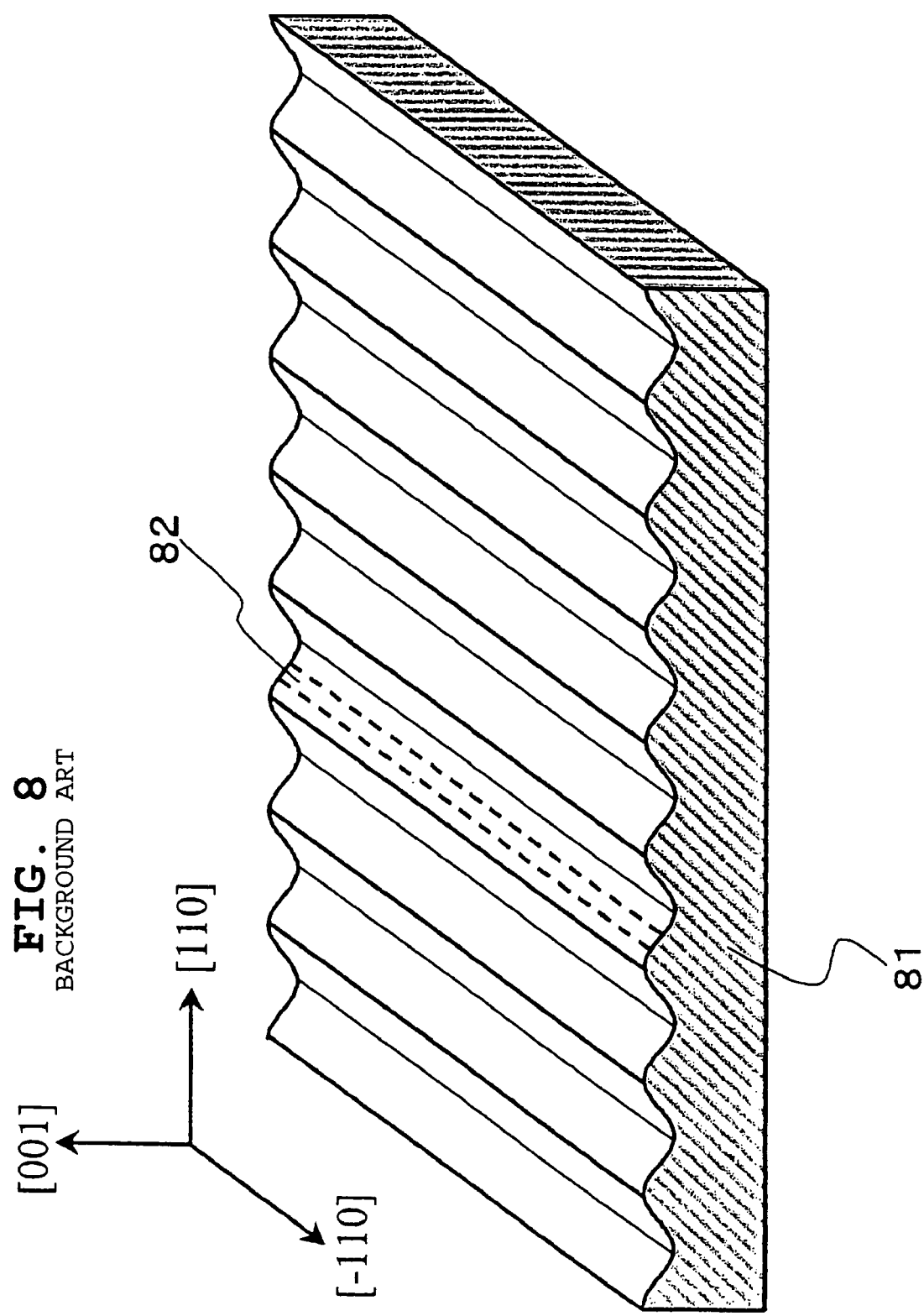
FIG. 8 is a schematic diagram showing a silicon single crystal substrate on which undulations have been fabricated so that their ridge is aligned in a single direction.
Figure 9:
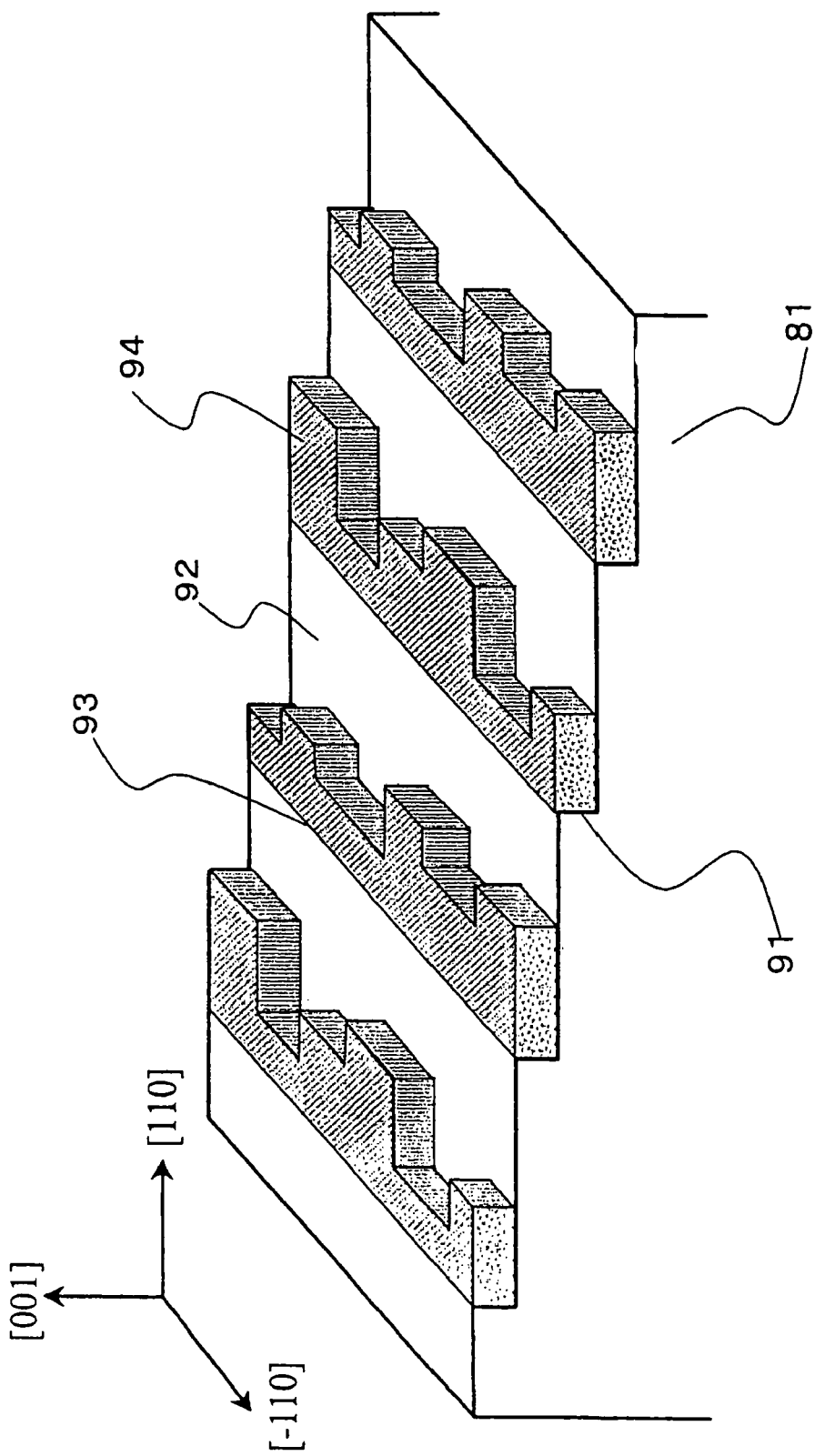
FIG. 9 is a schematic diagram showing the process by which a silicon carbide film is grown by way of a step flow.
Figure 10:
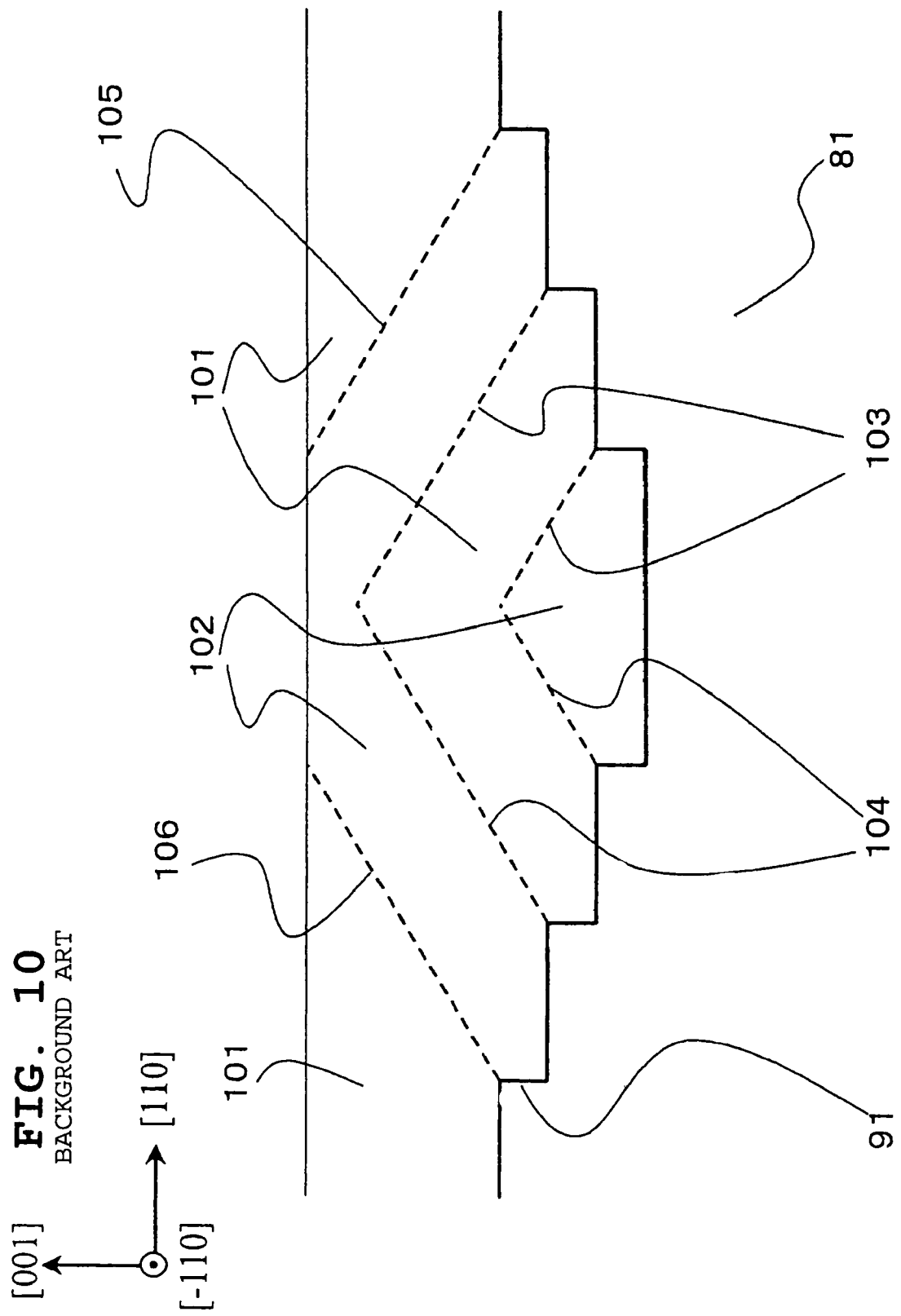
FIG. 10 is a schematic diagram showing the state of anti-phase boundaries for the case in which a silicon carbide film has been formed at a constant thickness.
Figure 11:
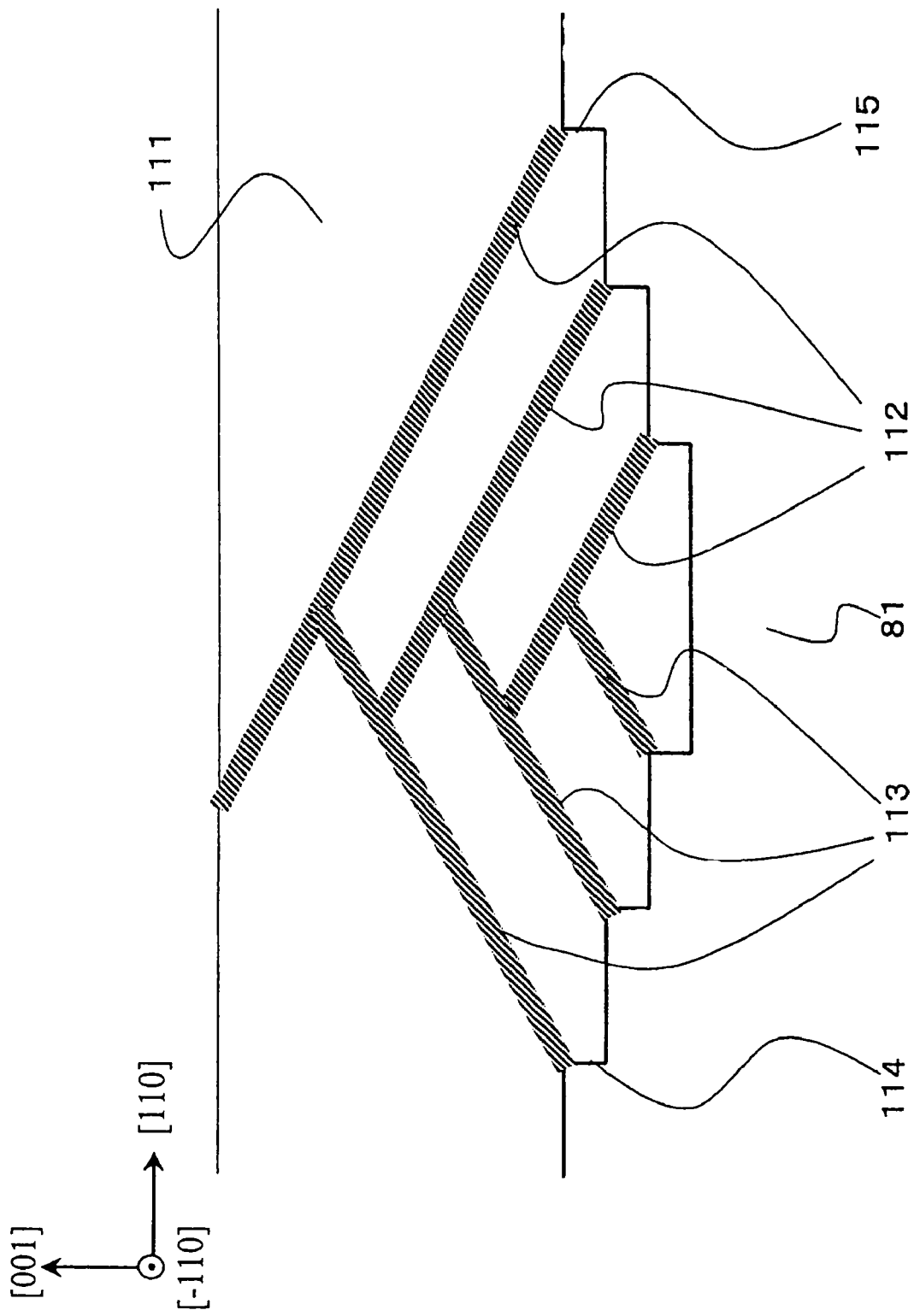
FIG. 11 is a schematic diagram showing the state in which a silicon carbide film has been formed on a silicon single crystal substrate on which undulations have been formed in the ridge direction and cross-ridge direction.
Figure 12:
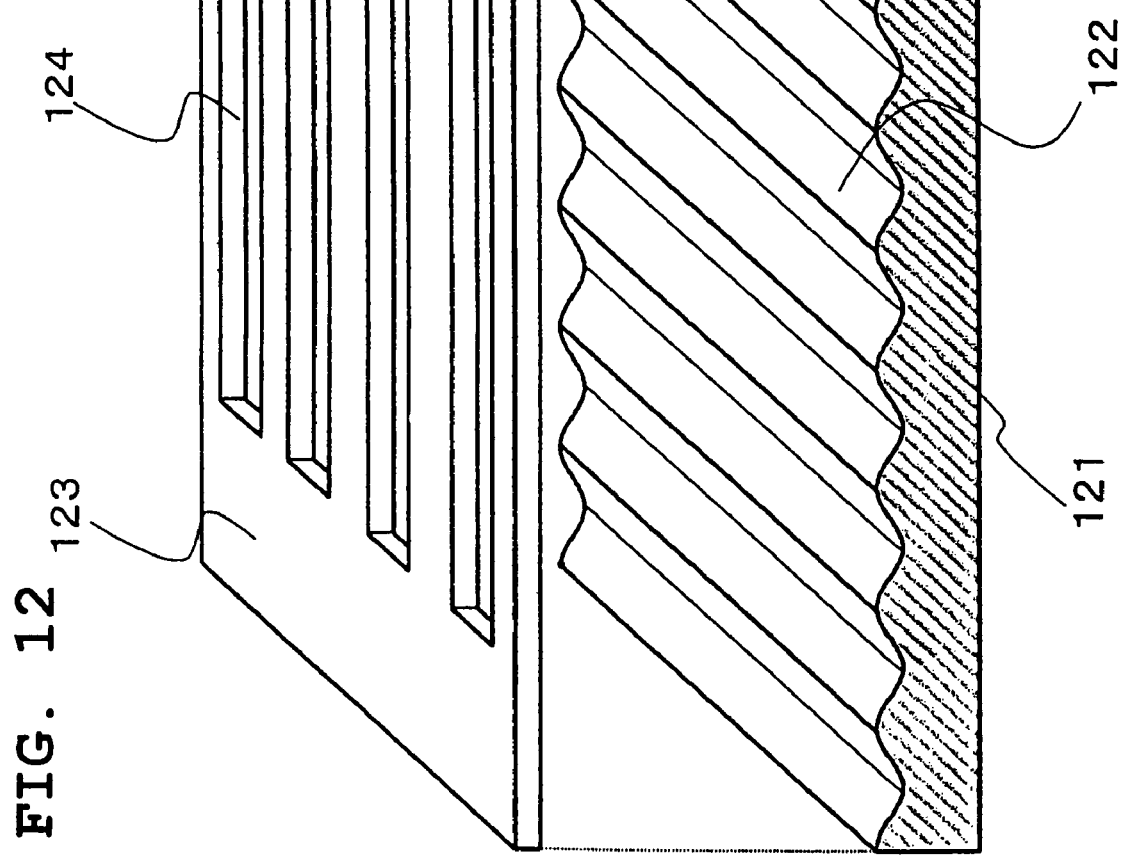
FIG. 12 is a schematic diagram showing the relative relationship between the stencil mask and the undulations during dry etching.
Figure 13:
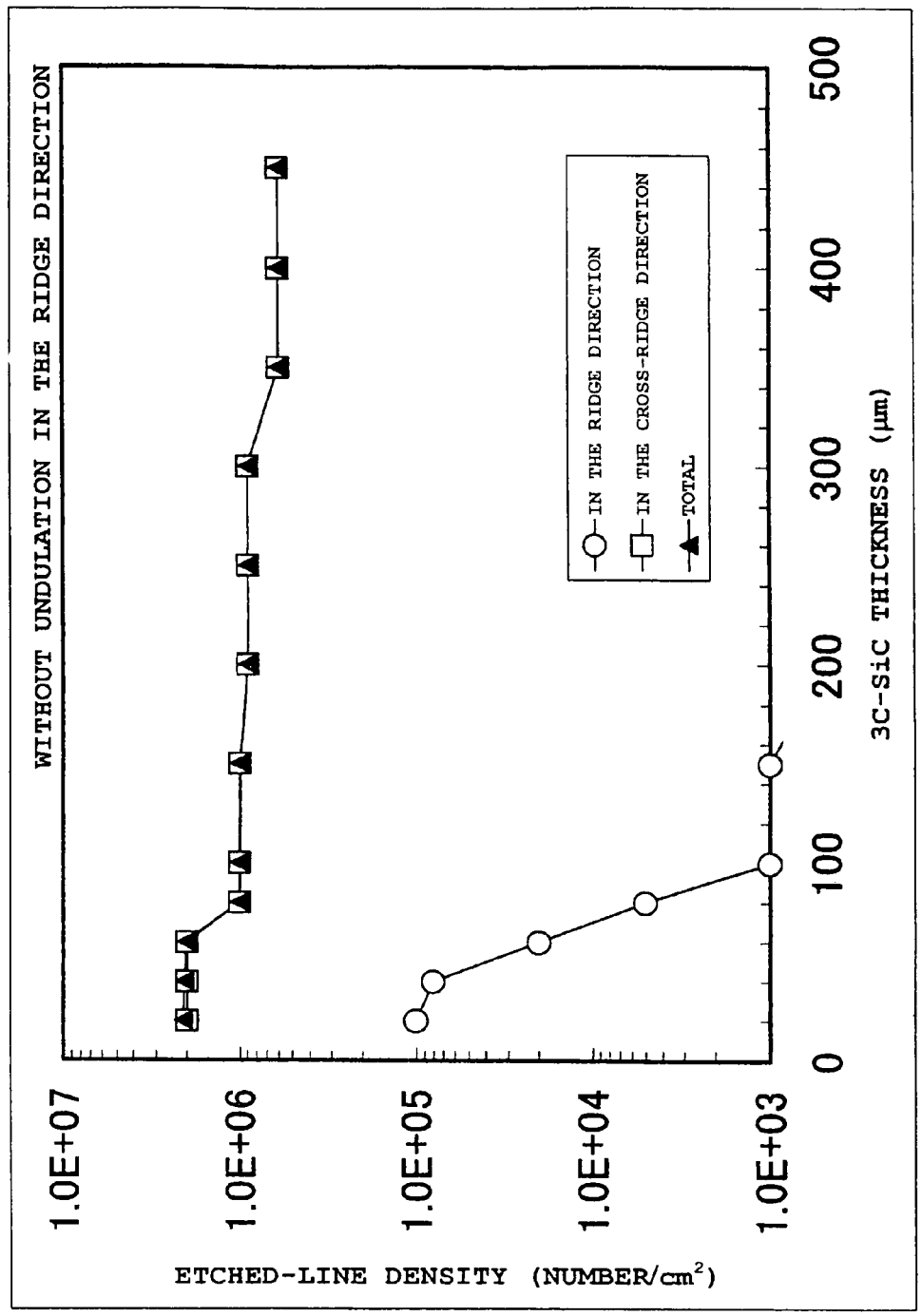
FIG. 13 is a diagram showing the dependency of the etched-line density on the 3C—SiC thickness.
Figure 14:
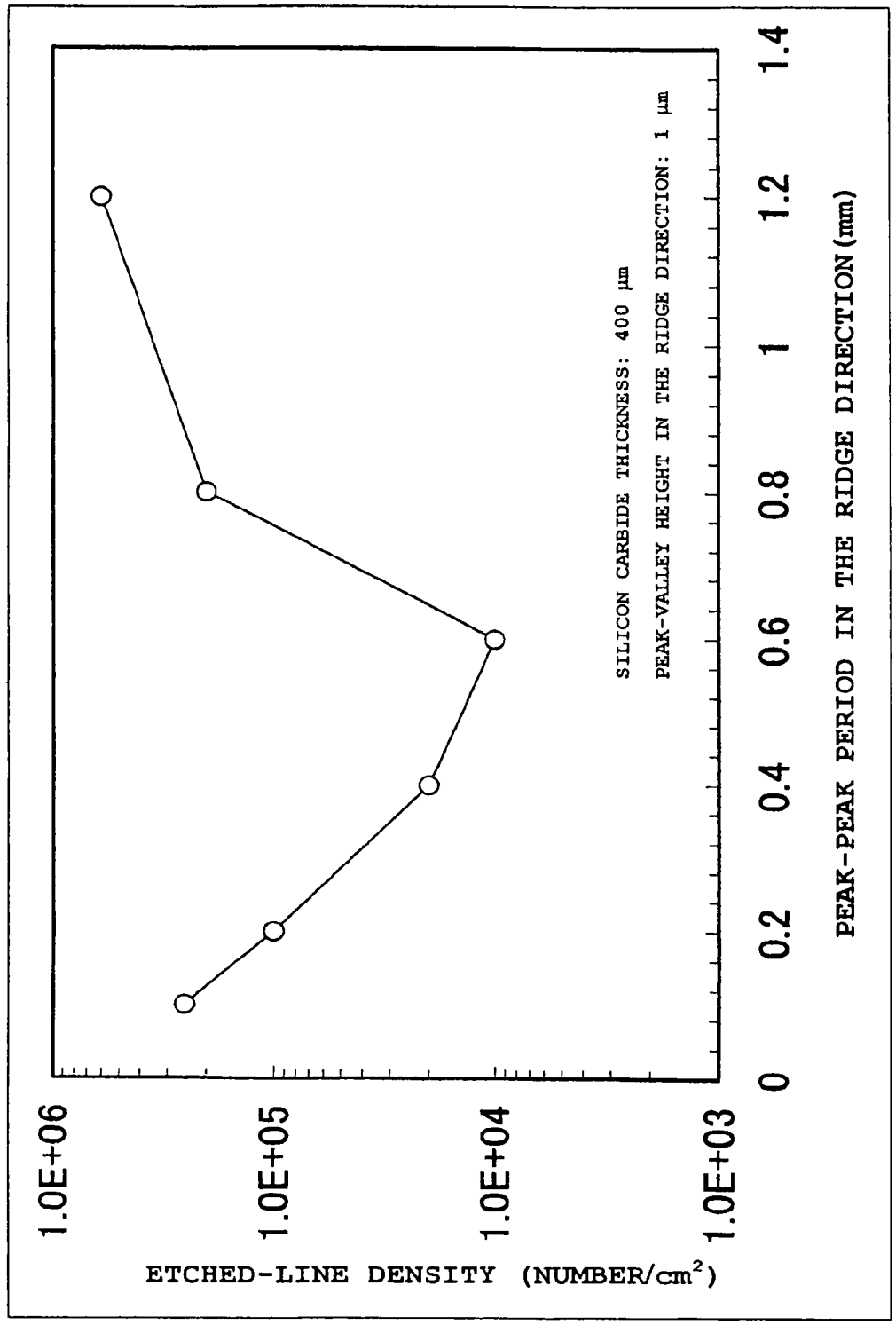
FIG. 14 is a diagram showing the dependency of the etched-line density on the peak-peak period in the cross-ridge direction.
Figure 15:
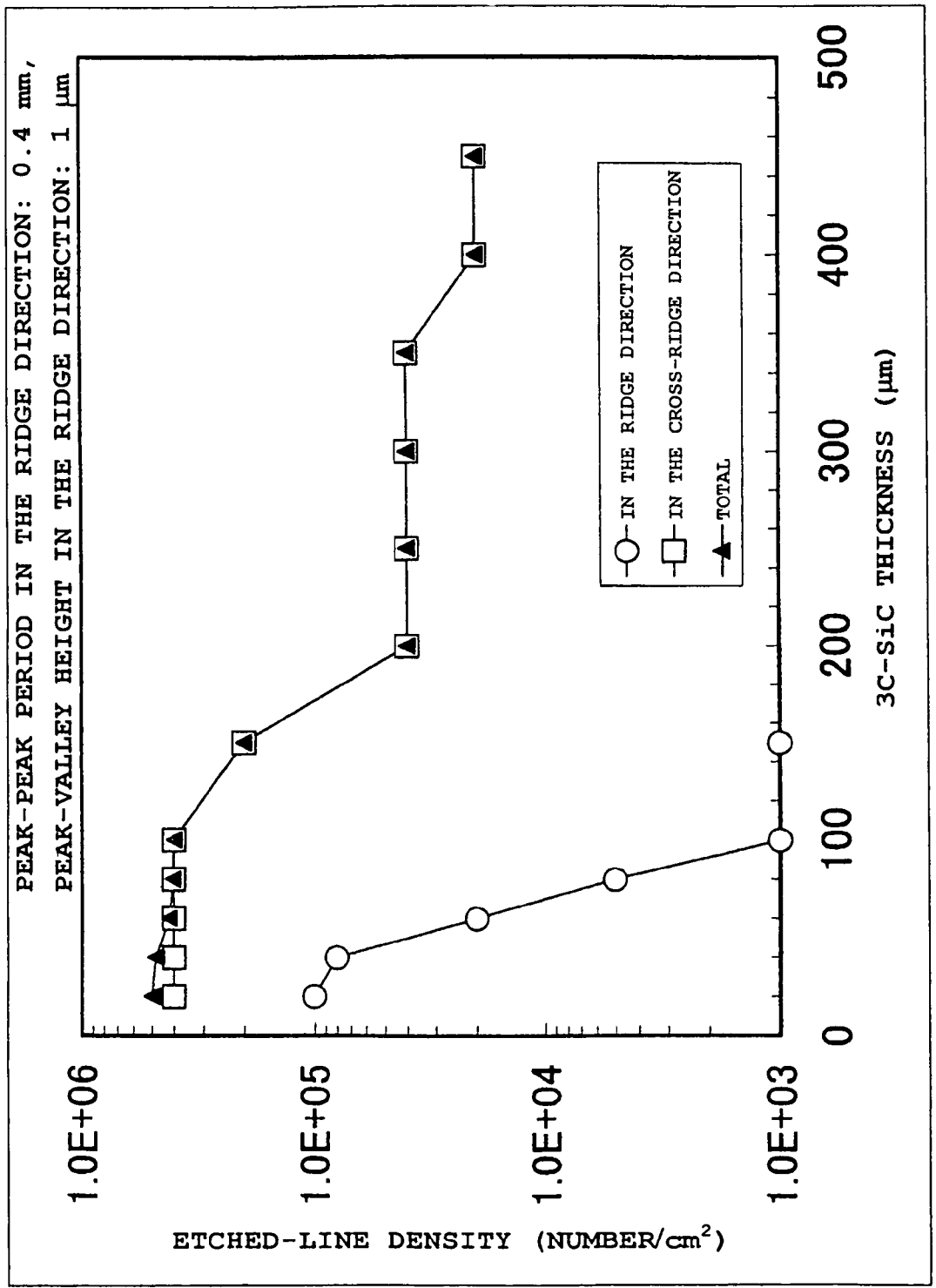
FIG. 15 is a diagram showing the dependency of the etched-line density on the 3C—SiC thickness.
Figure 16:
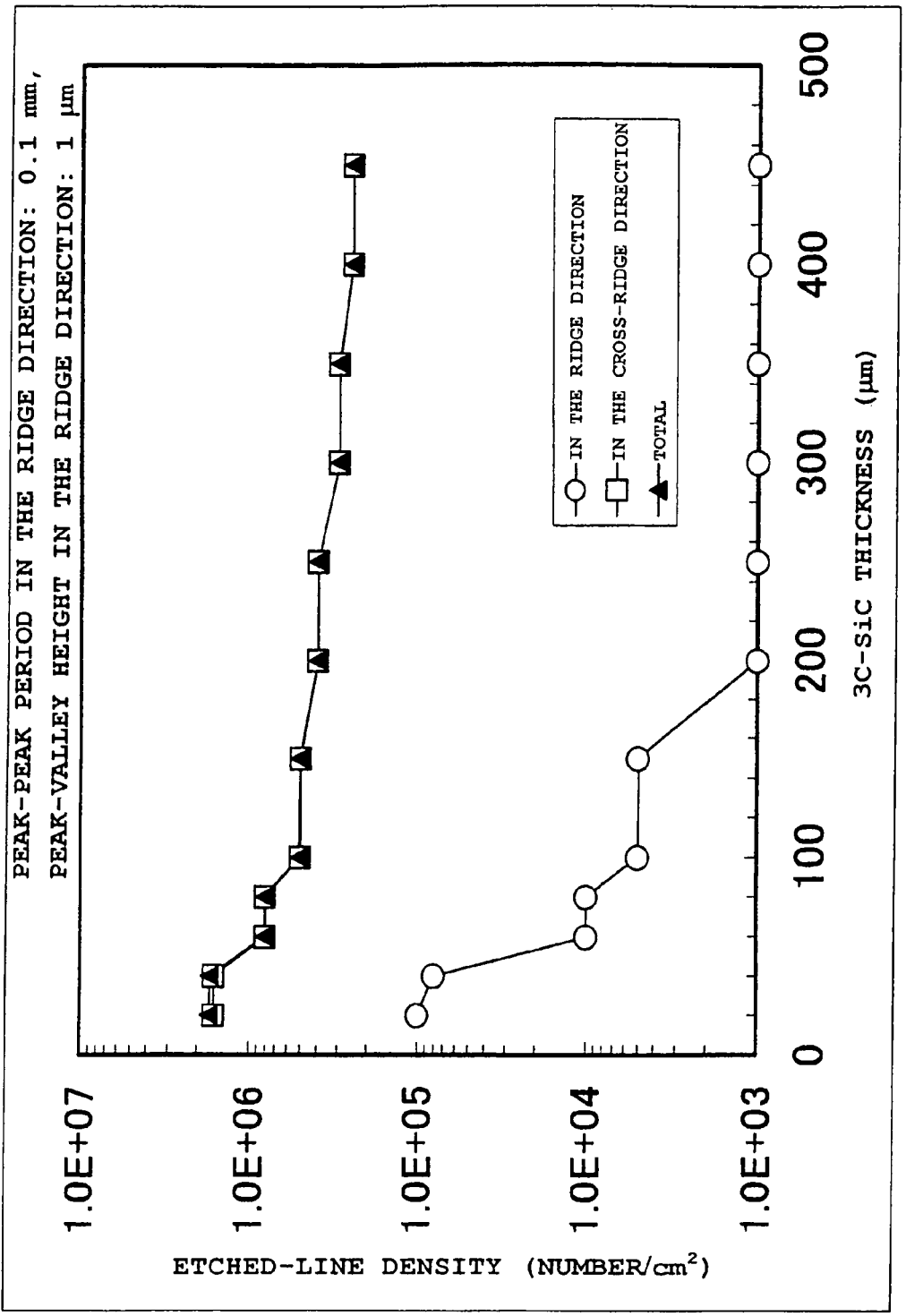
FIG. 16 is a diagram showing the dependency of the etched-line density on the 3C—SiC thickness.
Figure 17:
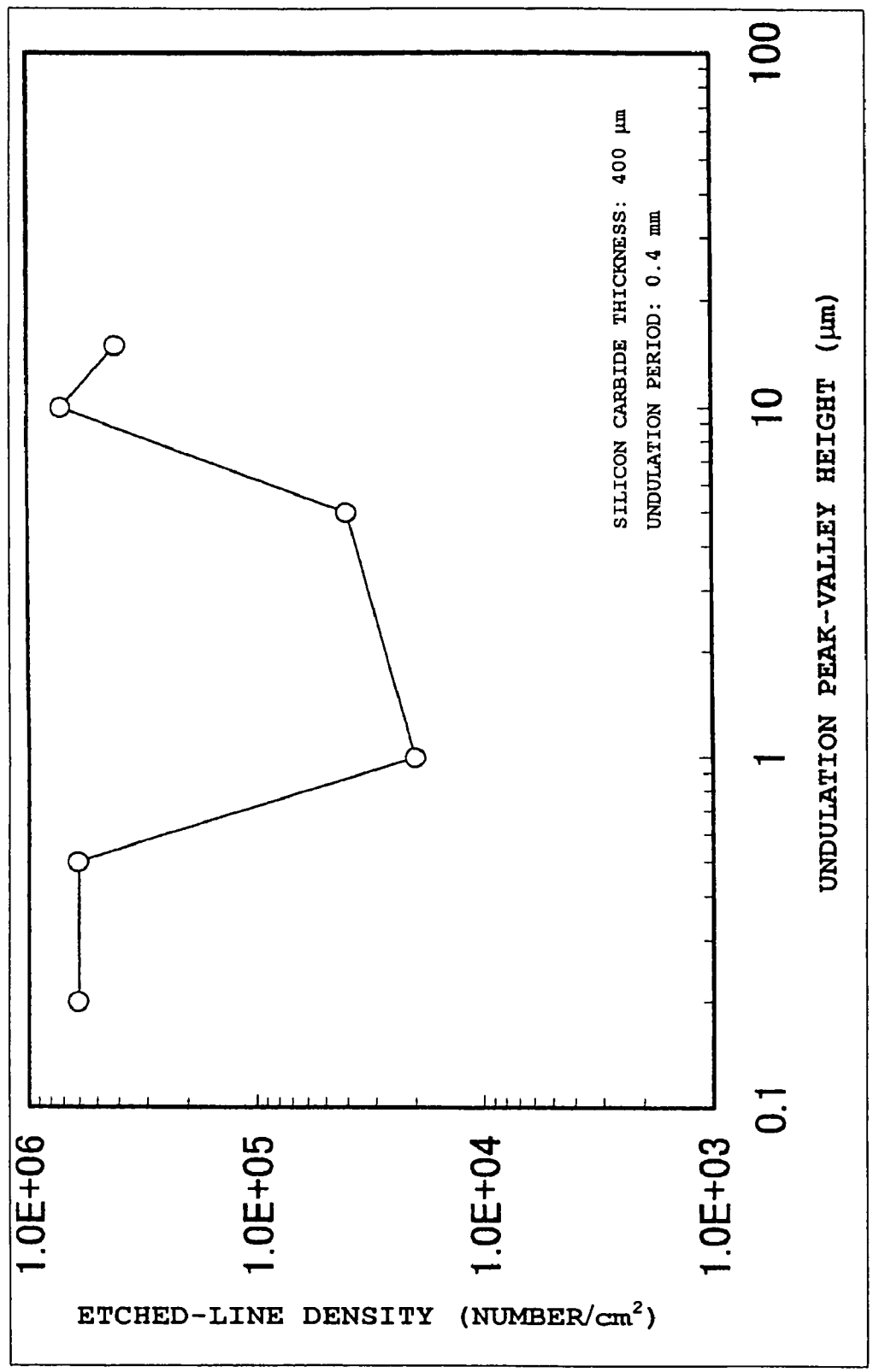
FIG. 17 is a diagram showing the dependency of the etched-line density on the peak-peak period in the cross-ridge direction.
Figure 18:
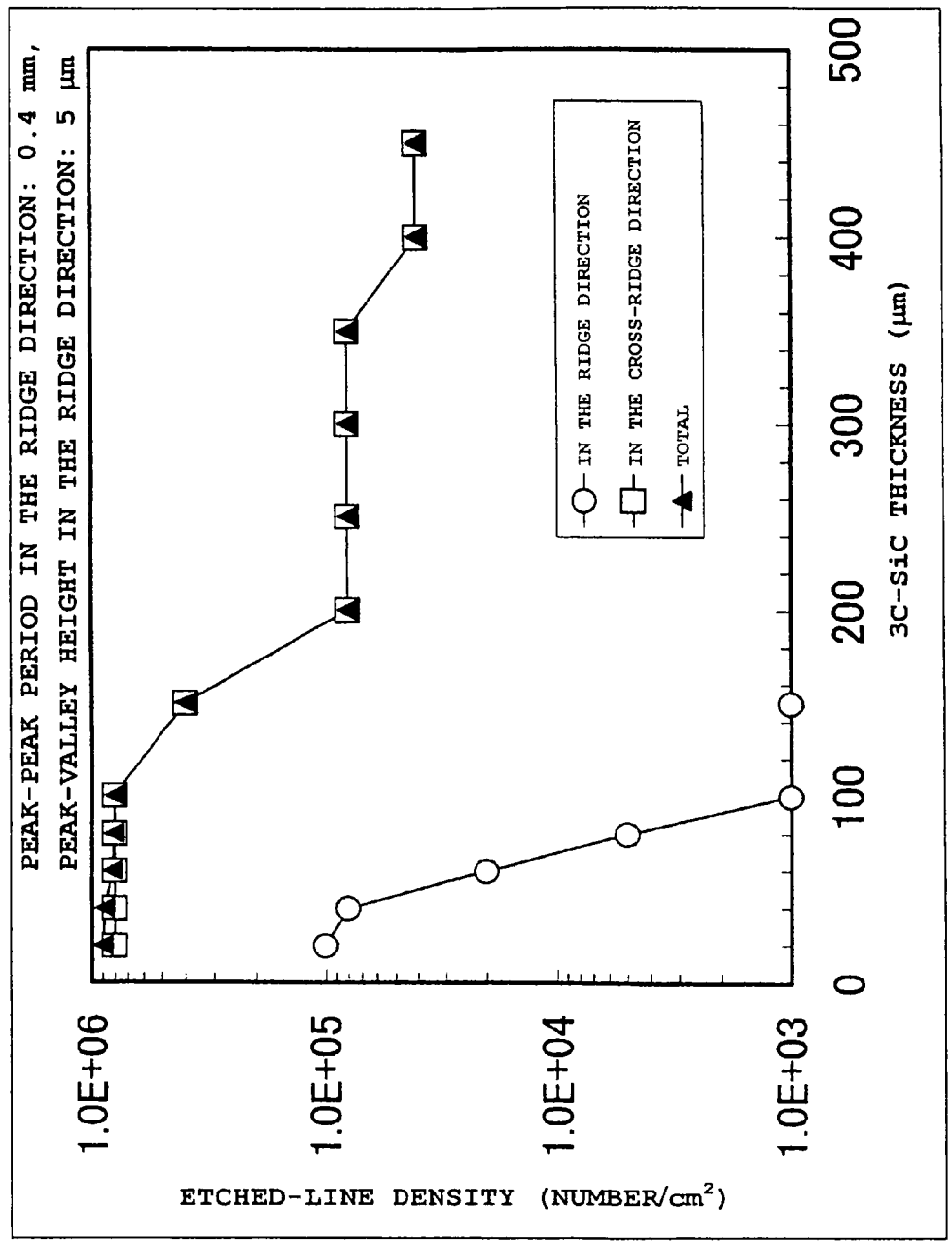
FIG. 18 is a diagram showing the dependency of the etched-line density on the 3C—SiC thickness.
Figure 19:
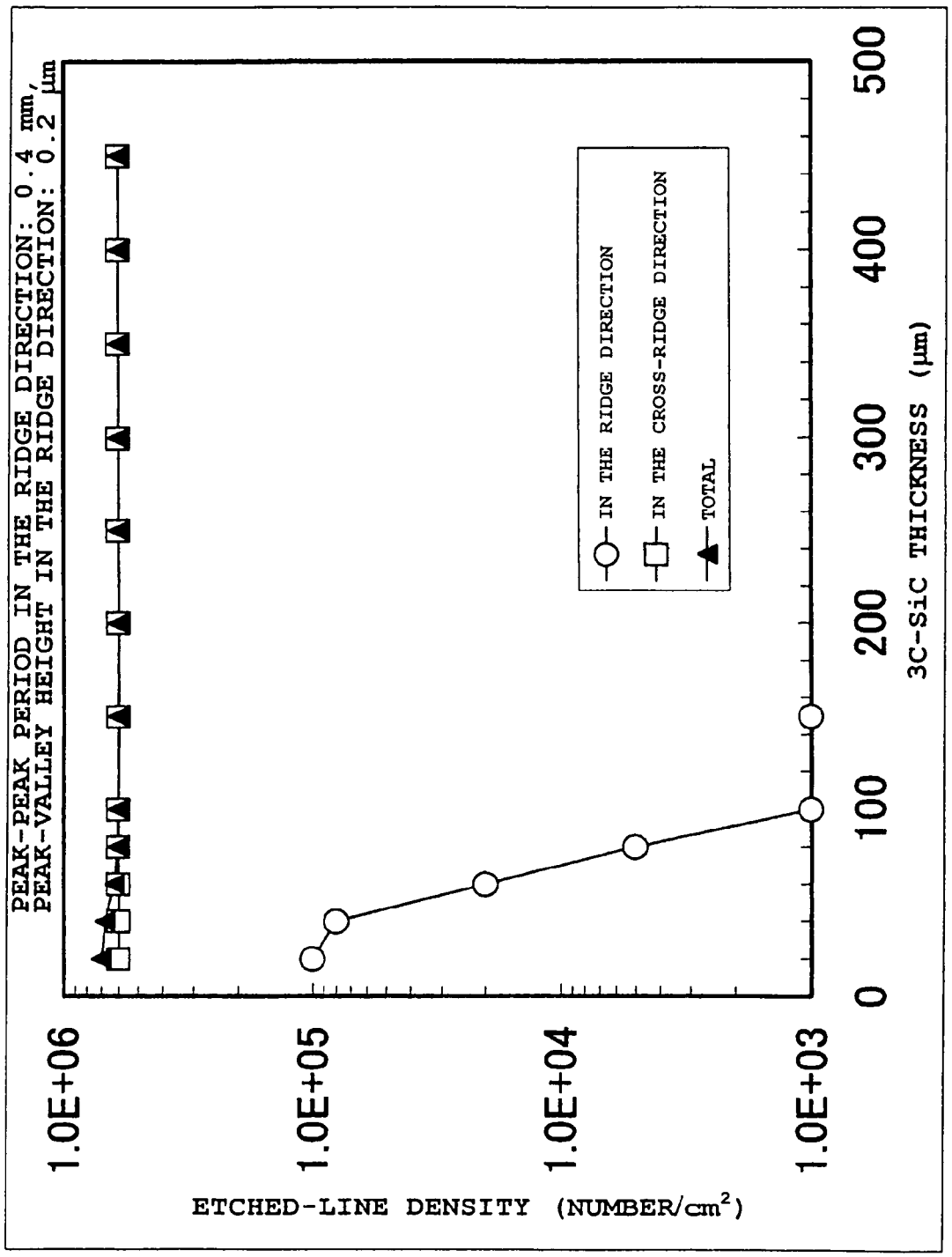
FIG. 19 is a diagram showing the dependency of the etched-line density on the 3C—SiC thickness.

| | |
|---|---|
| 1 | Silicon single crystal |
| 2 | Undulation ridges |
| 31 | Boundary that propagates parallel to the {1-11} planes as the thickness of the silicon carbide single crystal layer increases |
| 32 | Boundary that propagates parallel to the {-111} planes as the thickness of the silicon carbide single crystal layer increases |
| 41, 42, 43, 44 | Terraces on the surface of a silicon single crystal substrate |
| 50 | Off-substrate |
| 51 | Atomic level height step |
| 61 | Silicon carbide film |
| 62, 63 | Anti-phase boundaries |
| 64 | Junction of anti-phase boundaries |
| θ | Off-angle |
| φ | Angle formed by the Si(001) plane and the anti-phase boundary |
| 71 | Anti-phase boundary |
| 72, 73 | Deposited silicon carbide single crystal |
| 81 | Silicon carbide single crystal substrate |
| 82 | Area of a portion of the slope of the undulations oriented in the cross-ridge direction |
| 91 | Mono atomic height step |
| 92 | Terrace on the surface of a silicon carbide single crystal |
| 93 | Edge of steps |
| 94 | Silicon carbide single crystal |
| 101, 102 | Silicon carbide single crystal layers |
| 103, 105 | Anti-phase boundaries that propagate parallel to the {111} planes |
| 104, 106 | Anti-phase boundaries that propagate parallel to the {-1-11} planes |
| 111 | Silicon carbide single crystal film |
| 112 | Twin band that propagates parallel to the {-1-11} planes |
| 113 | Twin band that propagates parallel to the {111} planes |
| 114, 115 | Atomic level height steps |
| 121 | Si(001) substrate on which undulations have been fabricated |
| 122 | Formed undulations |
| 123 | Stencil mask |
| 124 | Rectangular aperture formed by the stencil mask |
| 411, 412, 421, 422, 431, 432, 441, 442 | edges of steps |

The invention claimed is:

1. A process for producing a silicon carbide single crystal in which a silicon carbide single crystal layer is homo-epitaxially or hetero-epitaxially grown on a surface of a single crystal substrate, wherein a plurality of substantially parallel undulation ridges that extend in a first direction on the single crystal substrate surface is formed on said single crystal substrate surface; each of the undulation ridges on said single crystal substrate surface has a height that undulates as each of the undulation ridges extends in the first direction; and the undulation ridges are disposed so that planar defects composed of anti-phase boundaries and/or twin bands that propagate together with the epitaxial growth of the silicon carbide single crystal merge with each other.

2. The process for producing the silicon carbide single crystal of claim 1, wherein the undulation ridges are on undulations that extend in the first direction, the undulations having alternating peaks and valleys on the single crystal substrate surface, wherein a relationship between a peak-peak period and a peak-valley height of the undulations in the cross-ridge direction, and a peak-peak period and a peak-valley height of the undulations in the ridge direction is such that when the silicon carbide single crystal is homo-epitaxially or hetero-epitaxially grown on said single crystal substrate surface, a number per unit area of the twin bands and/or the anti-phase boundaries in the ridge direction on the surface of said silicon carbide single crystal layer saturates in relation to an increase in thickness of said silicon carbide single crystal layer, and a number per unit area of the twin bands and/or the anti-phase boundaries in the cross-ridge direction decreases thereafter as the thickness of said silicon carbide single crystal layer further increases.

3. The process for producing the silicon carbide single crystal of claim 1, wherein the undulation ridges are on undulations that extend in the first direction, the undulations having alternating peaks and valleys on the single crystal substrate surface, wherein a relationship between a peak-peak period and a peak-valley height of the undulations in the cross-ridge direction, and a peak-peak period and a peak-valley height of the undulations in the ridge direction is such that when the silicon carbide single crystal is homo-epitaxially or hetero-epitaxially grown on said single crystal substrate surface, anti-phase domains on the surface of said silicon carbide single crystal layer pass through a state such that stripes that extend in the cross-ridge direction are formed, and occupancy of the anti-phase domains and/or occupancy of the twin bands on the surface of said silicon carbide single crystal layer decrease together with an increase in thickness of said silicon carbide single crystal layer.

4. The process for producing the silicon carbide single crystal of claim 1, wherein the undulation ridges are on undulations that extend in the first direction, the undulations having alternating peaks and valleys on the single crystal substrate surface, wherein a peak-peak period in the ridge direction is 100 to 700 times greater than a peak-peak period in the cross-ridge direction, and a value obtained by dividing the peak-peak period in the ridge direction by a peak-valley height in the ridge direction is 60 to 700.

5. The process for producing the silicon carbide single crystal of claim 4, wherein the peak-peak period in the ridge direction is in a range of 0.2 to 0.7 mm.

6. The process for producing the silicon carbide single crystal of claim 1, wherein said single crystal substrate is a silicon single crystal.

7. The process for producing the silicon carbide single crystal of claim 2, wherein said single crystal substrate is a silicon single crystal.

8. The process for producing the silicon carbide single crystal of claim 3, wherein said single crystal substrate is a silicon single crystal.

9. The process for producing the silicon carbide single crystal of claim 4, wherein said single crystal substrate is a silicon single crystal.

10. The process for producing the silicon carbide single crystal of claim 5, wherein said single crystal substrate is a silicon single crystal.

11. A process for producing a silicon carbide single crystal, the process comprising:
homo-epitaxially or hetero-epitaxially growing a silicon carbide single crystal layer on a surface of a single crystal substrate, wherein
the single crystal substrate surface includes a plurality of substantially parallel undulation ridges that extend in a first direction on the single crystal substrate surface such that the single crystal substrate surface is wavy in a cross-ridge direction that is orthogonal to the first direction in which the undulation ridges extend, the single crystal substrate surface also being wavy in a ridge direction that is parallel to the first direction in which the undulation ridges extend such that each of the undulation ridges has a height that undulates.

12. The process for producing the silicon carbide single crystal of claim 11, wherein the undulation ridges are disposed so that planar defects composed of anti-phase boundaries and/or twin bands that propagate together with the epitaxial growth of the silicon carbide single crystal merge with each other.

13. The process for producing the silicon carbide single crystal of claim 11, wherein said single crystal substrate is a silicon single crystal.

14. A process for producing a silicon carbide single crystal, the process comprising:
homo-epitaxially or hetero-epitaxially growing a silicon carbide single crystal layer on a surface of a single crystal substrate, wherein
the single crystal substrate surface includes a plurality of substantially parallel undulations that extend in a first direction on the single crystal substrate surface and a plurality of substantially parallel undulations that extend in a second direction that is substantially orthogonal to the first direction such that each undulation extending in the first direction includes (i) an undulation ridge at a highest part of the undulation that undulates along the first direction on the single crystal substrate surface and (ii) an undulation valley at a lowest part of the undulation that undulates along the first direction on the single crystal substrate surface.

15. The process for producing the silicon carbide single crystal of claim 14, wherein the undulations in the first and second directions are disposed so that planar defects composed of anti-phase boundaries and/or twin bands that propagate together with the epitaxial growth of the silicon carbide single crystal merge with each other.

16. The process for producing the silicon carbide single crystal of claim 14, wherein said single crystal substrate is a silicon single crystal.

* * * * *